United States Patent
Mochizuki

(10) Patent No.: US 8,315,109 B2
(45) Date of Patent: Nov. 20, 2012

(54) MEMORY INTERFACE CIRCUIT AND SEMICONDUCTOR DEVICE

(75) Inventor: Hideo Mochizuki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/272,856

(22) Filed: Oct. 13, 2011

(65) Prior Publication Data

US 2012/0113729 A1    May 10, 2012

(30) Foreign Application Priority Data

Nov. 4, 2010 (JP) ................................ 2010-247398

(51) Int. Cl.
*G11C 7/10* (2006.01)
(52) U.S. Cl. ............... 365/189.05; 365/193; 365/93; 365/194
(58) Field of Classification Search .......... 365/189.05, 365/193, 93, 194
See application file for complete search history.

(56) References Cited

U.S. PATENT DOCUMENTS

| 7,027,352 B2 * | 4/2006 | Jung ................... 365/185.17 |
| 2010/0023839 A1 | 1/2010 | Uneme |
| 2011/0176372 A1 | 7/2011 | Baba et al. |

FOREIGN PATENT DOCUMENTS

| JP | 2010-26896 A | 2/2010 |
| JP | 2010-86415 A | 4/2010 |

\* cited by examiner

*Primary Examiner* — Jason Lappas
(74) *Attorney, Agent, or Firm* — Foley & Lardner LLP

(57) ABSTRACT

There is a need to provide a small-sized memory interface circuit capable of adjusting timing between a strobe signal and a data signal without interrupting a normal memory access.
An expected value acquisition latch latches write data in synchronization with a clock signal. A WDLL outputs a write strobe signal WDQS. An RDLL outputs a delayed write strobe signal WDQS_d. A read data latch latches looped-back write data in synchronization with the delayed write strobe signal WDQS_d. A comparator compares the read data latch with an output from the expected value acquisition latch. A register portion stores a delay value to be placed in the RDLL. A register control portion updates a delay value in the register portion in accordance with a comparison result. A delay selection portion places a delay value read from the register portion in the RDLL.

14 Claims, 24 Drawing Sheets

MEMORY INTERFACE CIRCUIT AND SEMICONDUCTOR DEVICE

CROSS-REFERENCE TO RELATED APPLICATIONS

The disclosure of Japanese Patent Application No. 2010-247398 filed on Nov. 4, 2010 including the specification, drawings and abstract is incorporated herein by reference in its entirety.

BACKGROUND

The present invention relates to a memory interface circuit and a semiconductor device. More particularly, the invention relates to a memory interface circuit and a semiconductor device that adjust timings during normal memory access operations.

Recent computer systems use SDRAM (Synchronous Dynamic Random Access Memory) in order to respond to increased processes. Specifically, high-speed memory devices such as DDR2 (Double-Data-Rate2) SDRAM and DDR3 SDRAM are used. For example, DDR3 SDRAM inputs or outputs a data signal in synchronization with the rise or fall of a strobe signal.

The system mounted with such a memory device is subject to a timing difference between the strobe signal and the data signal due to a system state change in the temperature or voltages. The timing difference causes a data signal to be acquired unsuccessfully. To solve this problem, DDR3 SDRAM stops normal memory access operations such as writing and reading and frequently performs calibration that adjusts the timing between the strobe signal and the data signal. However, the calibration disables data wiring or reading and hinders high-speed data input/output.

To solve the problem, Japanese Patent Application Publication No. 2010-86415 proposes a memory interface that adjusts the timing between a strobe signal and a data signal during normal memory access operations. FIG. 24 is a function block diagram exemplifying a memory interface that adjusts the timing between a strobe signal and a data signal during normal memory access operations.

A memory system 1100 includes a memory device 1101 and a memory interface 1102. The memory device 1101 and the memory interface 1102 are coupled to each other at least through a data signal line 1112 and a strobe signal line 1113.

The memory device 1101 may be SDR (Single Data Rate) SDRAM or DDR (Double Data Rate) SDRAM. The SDR SDRAM latches data based on either the rising edge or the falling edge of a strobe signal. The DDR SDRAM latches data based on both the rising edge and the falling edge of a strobe signal.

The following describes a configuration and operations relating to either the rising edge or the falling edge of a strobe signal for simplicity.

Generally, the data signal line 1112 is bidirectional and is used to transfer data written to the memory device 1101 from the memory interface 1102 and data read from the memory device 1101. While FIG. 24 shows one data signal line, multiple data signal lines may be used corresponding to the strobe signal line 1113.

The strobe signal line 1113 is used to output a write strobe signal to the memory device 1101 from the memory interface 1102 when the memory interface 1102 writes data to the memory device 1101. The strobe signal line 1113 is used to output a read strobe signal to the memory interface 1102 from the memory device 1101 when the memory interface 1102 reads data from the memory device 1101. The strobe signal line 1113 is generally bidirectional.

The memory interface 1102 includes a first data latch portion 1103, a first variable delay portion 1104, a first delay control portion 1105, a second data latch portion 1106, a second variable delay portion 1107, a second delay control portion 1108, a comparator 1109, a delay determination portion 1110, a toggle detector 1111, and a direction control portion 1114.

If DDR SDRAM is used for the memory device 1101, one strobe signal line 1113 may be provided with two sets of the components of the memory interface 1102 corresponding to the rising edge and the falling edge of a strobe signal. The timing can be independently adjusted for the rising edge and the falling edge of a strobe signal.

As described above, the data signal line 1112 is generally bidirectional. The direction control portion 1114 controls the data signal line 1112 in a direction of transferring write data 1115 from an applied device and in a direction of transferring read data to the first data latch portion 1103 and the second data latch portion 1106.

The applied device is equivalent to a circuit that uses the memory device 1101 via the memory interface 1102. The invention does not limit functions of the applied device. The applied device receives read data 1116 from the memory interface 1102. The applied device may be provided as a CPU (central processing unit) as an example.

The first data latch portion 1103 latches data transferred through the direction control portion 1114 using a strobe signal that is transferred from the strobe signal line 1113 and is delayed in the first variable delay portion 1104. The latched information is not only transferred to the applied device but also transferred to the comparator 1109.

The second data latch portion 1106 latches data transferred through the direction control portion 1114 using a strobe signal that is transferred from the strobe signal line 1113 and is delayed in the second variable delay portion 1107. The latched information is transferred to not only the comparator 1109 but also the toggle detector 1111.

The first variable delay portion 1104 adjusts the timing of a strobe signal transferred through the strobe signal line 1113 in relation to a data signal transferred to the first data latch portion 1103 through the data signal line 1112 and the direction control portion 1114. The first variable delay portion 1104 includes a delay line capable of changing a delay amount. The delay line can adjust the timing.

The second variable delay portion 1107 adjusts the timing of a strobe signal transferred through the strobe signal line 1113 in relation to a data signal transferred to the second data latch portion 1106 through the data signal line 1112 and the direction control portion 1114. The second variable delay portion 1107 includes a delay line capable of changing a delay amount. The delay line can adjust the timing.

The first delay control portion 1105 is supplied with a delay setting amount from the delay determination portion 1110 and accordingly calculates an adjustment amount for the delay line included in the first variable delay portion 1104 to configure the first variable delay portion 1104.

The second delay control portion 1108 is supplied with a delay setting amount from the delay determination portion 1110 and accordingly calculates an adjustment amount for the delay line included in the second variable delay portion 1107 to configure the second variable delay portion 1107.

The comparator 1109 compares the value of data latched in the first data latch portion 1103 with the value of data latched in the second data latch portion 1106 and supplies a comparison result to the delay determination portion 1110.

The delay determination portion 1110 records the result from the comparator 1109, the delay setting amount for the first delay control portion 1105, and the delay setting amount for the second delay control portion 1108 at that time. This record is used to appropriately update and set the delay setting amounts for the first delay control portion 1105 and the second delay control portion 1108.

In the memory system 1100, the previously calibrated first data latch portion 1103 latches read data in synchronization with the strobe signal delayed through the first variable delay portion 1104. The second data latch portion 1106 latches read data in synchronization with the strobe signal delayed through the second variable delay portion 1107. An output value from the first data latch portion 1103 is compared with the second data latch portion 1106 at the timing an output from the first data latch portion 1103 toggles.

Let us suppose that the output value from the first data latch portion 1103 is equal to that from the second data latch portion 1106. In this case, the second delay control portion 1108 adjusts the delay amount in the second variable delay portion 1107 so as to increase a difference from the delay amount in the first variable delay portion 1104. The adjustment continues until the output value from the first data latch portion 1103 becomes unequal to that from the second data latch portion 1106. It is possible to find the delay amount as a criterion to determine whether the output value from the first data latch portion 1103 is equal or unequal to that from the second data latch portion 1106.

Let us suppose that the output value from the first data latch portion 1103 is unequal to that from the second data latch portion 1106. In this case, the second delay control portion 1108 adjusts the delay amount in the second variable delay portion 1107 so as to decrease a difference from the delay amount in the first variable delay portion 1104. The adjustment continues until the output value from the first data latch portion 1103 becomes equal to that from the second data latch portion 1106. It is possible to find the delay amount as a criterion to determine whether the output value from the first data latch portion 1103 is equal or unequal to that from the second data latch portion 1106.

A delay amount plus safety allowance is calculated with reference to the delay amount as a criterion to determine whether the output value from the first data latch portion 1103 is equal or unequal to that from the second data latch portion 1106. The first delay control portion 1105 supplies the first variable delay portion 1104 with the delay amount plus safety allowance during a refresh operation generally performed in the DRAM. This makes it possible to update the delay amount to be supplied to the first variable delay portion 1104. As a result, the timing between a strobe signal and a data signal can be adjusted without repetition of the calibration.

Japanese Patent Application Publication No. 2010-26896 proposes a memory system that adjusts the timing between a strobe signal and a data signal using a phase interpolator.

SUMMARY

However, the memory interface as disclosed in Japanese Patent Application Publication No. 2010-86415 includes the blocks that only adjust the delay amount for the first variable delay portion 1104. That is, the second data latch portion 1106, the second variable delay portion 1107, the second delay control portion 1108, the comparator 1109, the delay determination portion 1110, and the toggle detector 1111 function only in order to adjust the delay amount for the first variable delay portion 1104, not to write or read data. In other words, the memory interface as disclosed in Japanese Patent Application Publication No. 2010-86415 needs to install a block that is independent of data writing or reading. As a result, the memory interface circuit scale increases. This causes a bottleneck to the memory system miniaturization.

The memory system disclosed in Japanese Patent Application Publication No. 2010-26896 also needs to install a phase interpolator that is independent of data writing or reading. Accordingly, the memory system is subject to the same problem as with the above-mentioned memory interface.

According to an aspect of the present invention, a memory interface circuit includes: a data output buffer that outputs write data received from outside during writing to a memory device; a write delay-locked loop that outputs a write strobe signal to the memory device through a strobe signal output buffer, wherein the write strobe signal is generated by delaying a phase of a clock signal received from outside during writing; a first latch that latches the write data from the outside in synchronization with the clock signal; a data input buffer that outputs read data received from the memory device during reading; a read delay-locked loop that outputs a delayed read strobe signal generated by delaying a phase of a read strobe signal received from the memory device through a strobe signal input buffer during reading and outputs a delayed write strobe signal generated by delaying a write strobe signal looped back from the strobe signal output buffer through the strobe signal input buffer during writing; a second latch that latches the read data from the data input buffer during reading in synchronization with the delayed read strobe signal and latches the write data looped back from the data output buffer through the data input buffer during writing in synchronization with the delayed write strobe signal; a comparator that compares output from the first latch with output from the second latch during writing and outputs a comparison result as a comparison result signal; a register portion that stores a delay value to be supplied to the read delay-locked loop in order to delay one of the write strobe signal and the read strobe signal; a register control portion that updates the delay value stored in the register portion in accordance with the comparison result signal; and a delay selection portion that is controlled by the register control portion and supplies the read delay-locked loop with the delay value stored in the register portion.

The memory interface circuit loops back the write data and can thereby optimize a read delay value during writing while the value is supplied to the read delay-locked loop during reading. Accordingly, the memory interface circuit need not frequently perform calibration while interrupting a normal memory access operation during writing or reading. There is no need to provide an excess circuit that might be used only for the calibration because the memory interface circuit uses the loopback operation during writing. As a result, it is possible to provide a small-sized memory interface circuit capable of adjusting timing between a strobe signal and a data signal without interrupting a normal memory access.

The present invention can provide a small-sized memory interface circuit capable of adjusting timing between a strobe signal and a data signal without interrupting a normal memory access.

DETAILED DESCRIPTION

Figure 1:
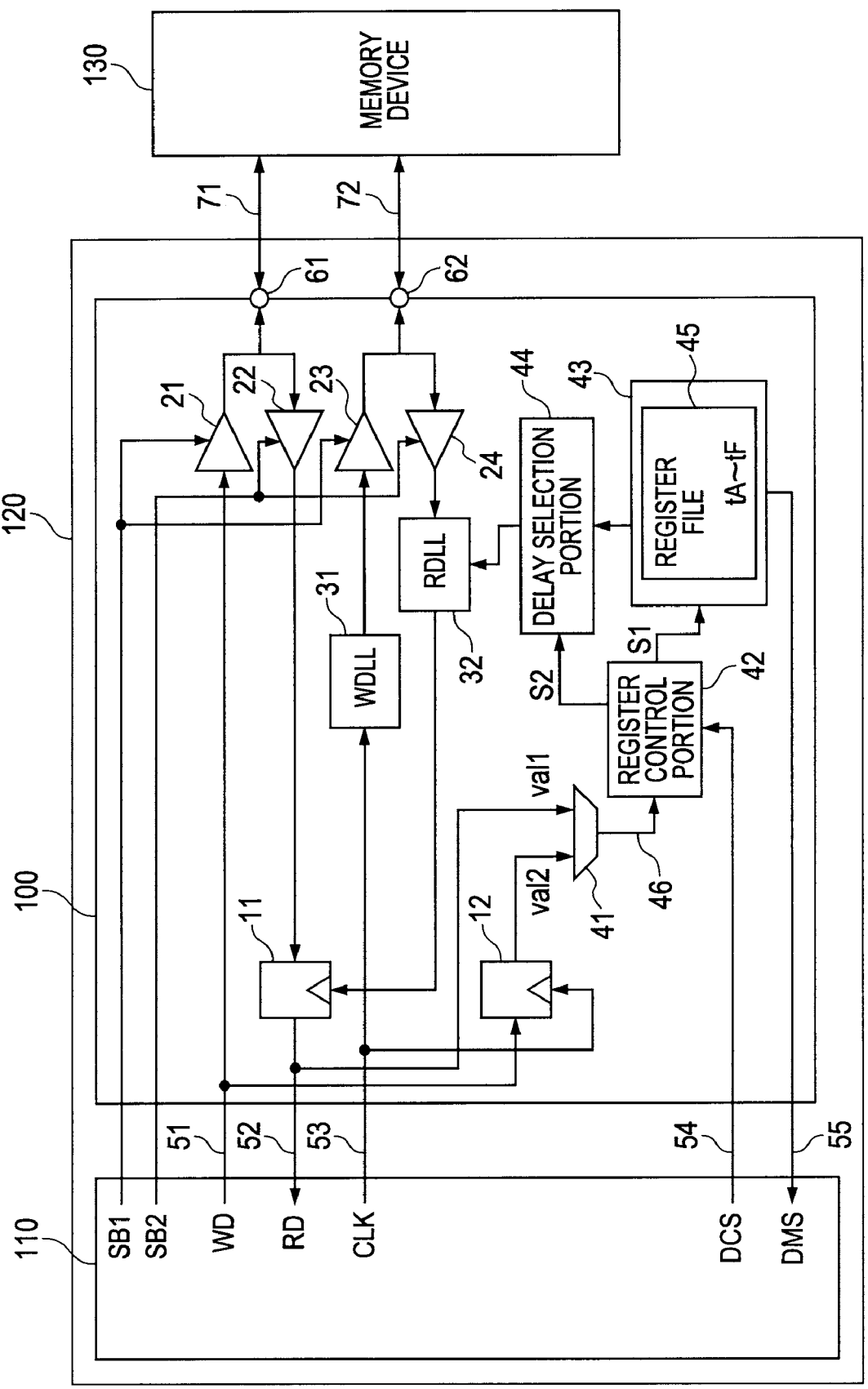
FIG. 1 is a circuit block diagram showing a configuration of a semiconductor device including a memory interface circuit according to a first embodiment of the invention.

Embodiments of the present invention will be described in further detail with reference to the accompanying drawings. The same parts or components are depicted by the same reference numerals and a duplicate description is omitted as needed.

First Embodiment

The memory interface circuit according to the first embodiment will be described. The first embodiment describes an example of using DDR3 SDRAM. FIG. 1 is a circuit block diagram showing a configuration of a semiconductor device 120 including a memory interface circuit 100 according to a first embodiment of the invention. The semiconductor device 120 includes the memory interface circuit 100 and an external circuit 110. The semiconductor device 120 is coupled to an external memory device 130 and functions as a memory controller. As described above, the embodiment uses DDR3 SDRAM as the memory device 130. The memory interface circuit 100 mediates data exchange between the external circuit 110 and the memory device 130.

The configuration of the memory interface circuit 100 will be described in detail. The input to a write data output buffer 21 is coupled to the external circuit 110 through a write data signal line 51. The output from the write data output buffer 21 is coupled to the input to a read data input buffer 22 and a data terminal 61. The data terminal 61 is coupled to the memory device 130 through one or more data signal lines 71. The output from the read data input buffer 22 is coupled to the input to a read data latch 11. The output from the read data latch 11 is coupled to the external circuit 110 through a read data signal line 52.

The input to a write delay-locked loop (WDLL) 31 is coupled to the external circuit 110 through a clock signal line 53. The output from the WDLL 31 is coupled to the input to a strobe signal output buffer 23. The output from the strobe signal output buffer 23 is coupled to the input to a strobe signal input buffer 24 and a strobe terminal 62. The strobe terminal 62 is coupled to the memory device 130 through one or more strobe signal lines 72. The output from the strobe signal input buffer 24 is coupled to the input to a read delay-locked loop (RDLL) 32. The output from the RDLL 32 is coupled to the enable input to the read data latch 11.

The WDLL 31 outputs a write strobe signal WDQS with a 90-degree delay in the phase of an input clock signal CLK. The RDLL 32 outputs a signal by delaying the phase of an input signal.

The input to an expected value acquisition latch 12 is coupled to the external circuit 110 through the write data signal line 51. The enable input to the expected value acquisition latch 12 is coupled to the external circuit 110 through the clock signal line 53.

The comparator 41 has two inputs. One input to the comparator 41 is coupled to the output (result value val1) from the read data latch 11. The other input to the comparator is coupled to the output (expected value val2) from the expected value acquisition latch 12. A comparison result from the comparator 41 is output as a comparison result signal 46 to a register control portion 42. The register control portion outputs a control signal to a register portion 43 or a delay selection portion 44 in accordance with the comparison result signal 46 or a delay control signal DCS input through a delay control signal line 54.

The register portion 43 stores a register file 45. The register file 45 contains a left loopback fail value tA, a left loopback slot tB, a right loopback slot tC, a right loopback fail value tD, an estimated left slot value tE, an estimated right slot value tF, and a read delay value tG. These values will be described later in terms of their roles and how to determine them. A control signal S1 from the register control portion 42 initializes or updates the values tA through tG in the register file 45. To monitor the values tA through tG in the register file 45, the external circuit 110 reads the values tA through tG from the register file 45 as a delay monitor signal DMS through a delay monitor signal line 55.

The delay selection portion 44 reads any one of the values tA through tG in the register file 45 from the register portion 43 in accordance with the control signal S2 from the register control portion 42. The delay selection portion 44 sets the read value as a delay amount for the RDLL 32. The RDLL 32 supplies a signal input to the RDLL 32 with the delay amount (any one of the values to through tG in the register file 45) set by the delay selection portion 44.

The following describes an overview of write and read operations of the memory interface circuit 100. First, a read operation will be described. During a read operation, the memory device 130 outputs read data RD to the read data input buffer 22. The read data RD is read at the same frequency as a data rate. The read data RD is output as a data signal whose burst length is 8, for example.

The memory device 130 supplies the RDLL 32 with a read strobe signal RDQS through the strobe signal input buffer 24. The read strobe signal RDQS is supplied at the same frequency as the data rate. The read strobe signal RDQS is supplied as a differential read strobe signal, for example. For ease of description, FIG. 1 illustrates the read strobe signal RDQS as one signal.

The RDLL 32 outputs a delayed read strobe signal RDQS_d to the read data latch 11. The delayed read strobe signal RDQS_d is equivalent to the read strobe signal RDQS supplied with a read delay value tG. The read delay value tG is previously given to the RDLL 32.

The read data latch 11 latches the read data RD in synchronization with the delayed read strobe signal RDQS_d. The read data latch 11 outputs the latched read data RD to the external circuit 110. In this manner, data is read from the memory device 130.

Second, a write operation will be described. During a write operation, the external circuit 110 supplies write data WD to the memory device 130 through the write data output buffer 21. The external circuit 110 supplies the clock signal CLK to the WDLL 31. The WDLL 31 outputs the write strobe signal WDQS with a 90-degree delay in the phase of the input clock signal CLK to the memory device 130. The write data WD is written to the memory device 130 in synchronization with the write strobe signal WDQS.

The write data WD is looped back to the read data latch through the read data input buffer 22. The write strobe signal WDQS is input to the RDLL 32 through the strobe signal input buffer 24. The RDLL 32 generates a delayed write strobe signal WDQS_d by supplying the write strobe signal WDQS with any one of the values to through tF in the register file 45. The delayed write strobe signal WDQS_d is output to the read data latch 11.

The read data latch 11 latches the looped-back write data WD in synchronization with the delayed write strobe signal WDQS_d. The read data latch 11 outputs the latched write data WD as the result value val1 to the comparator 41.

The expected value acquisition latch 12 latches the write data WD in synchronization with the clock signal CLK. The expected value acquisition latch 12 outputs the latched write data WD as the expected value val2 to the comparator 41.

The comparator 41 compares the result value val1 with the expected value val2. The comparator 41 determines whether the result value val1 is equal to the expected value val2 (hereafter denoted as PASS) or is unequal to the same (hereafter denoted as FAIL). The comparator 41 outputs the comparison result signal 46 to the register control portion 42. The register control portion 42 determines a delay value to be supplied to the RDLL 32 by operating the register portion 43 and the delay selection portion 44 in accordance with the comparison result signal 46.

In other words, the memory interface circuit 100 compares the looped-back write data WD (result value val1) with the non-looped-back write data WD (expected value val2). Theoretically, the result value val1 is equal to the expected value val2 since the same data is compared with each other. However, the looped-back write data WD needs to travel an extra path from the read data input buffer 22 to the read data latch 11.

The read path state varies with a temperature change in the semiconductor device 120. The variation might deviate the latch timing for the read data latch 11. In other words, the delayed read strobe signal RDQS_d supplied from the RDLL 32 might have an improper phase. In such a case, it is just necessary to adjust the delay value supplied to the RDLL 32 and supply a proper delayed read strobe signal RDQS_d. The memory interface circuit 100 can adjust the delay value supplied to the RDLL 32 in accordance with a comparison result (comparison result during the loopback operation) between the result value val1 and the expected value val2. The delay value for the RDLL 32 can be adjusted using not only the write data WD but also test data supplied through the same path as that for the write data WD.

The following describes roles of the values tA through tG in the register file according to the first embodiment. The values tA through tG in the register file 45 will be described first. The memory interface circuit 100 determines the values tA through tG in the register file 45 using a loopback operation of write data WD during a write operation (hereafter referred to as a loopback test).

Figure 2:
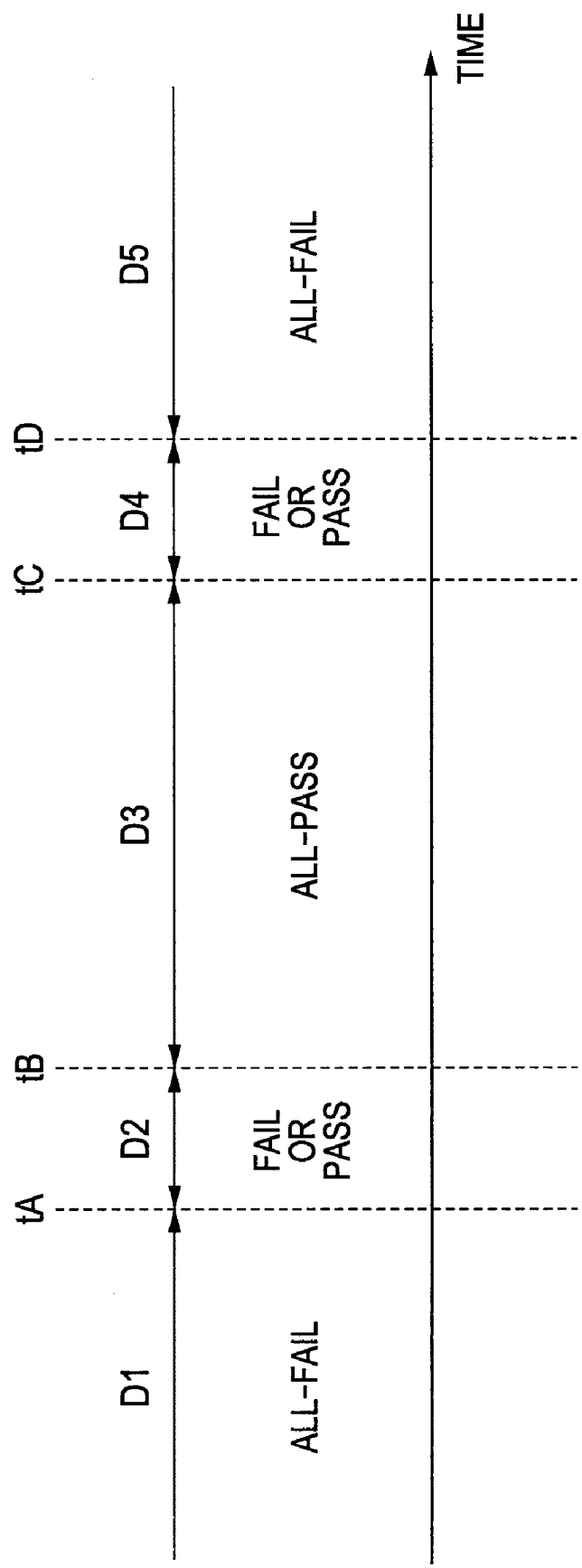
FIG. 2 shows relation between values in a register file and comparison results from a loopback test for a comparator according to the first embodiment.

FIG. 2 shows relation between the values tA through tD in the register file 45 and comparison results from a loopback test for the comparator 41. The comparison result from the comparator 41 varies with a delay value supplied to the RDLL 32 during the loopback test. A period D3 ensures a delay value that makes the result value val1 and the expected value val2 equal to each other in all the loopback tests (hereafter denoted as ALL-PASS). All the loopback operations result in PASS when the RDLL 32 is supplied with the delay value within the period D3.

Results of the loopback test will be described. The following example assumes that the DDR3 SDRAM is supplied with the write data WD as a data signal with burst length 8. The data signal with burst length 8 contains data of consecutive eight bits. The comparator 41 compares the result value val1 with the expected value val2 for each of the eight bits. Accordingly, the comparator 41 performs the comparison on the 8-bit data eight times.

Supposing that data with burst length 8 is equivalent to one set, multiple sets of write data are supplied. If four sets of data are supplied, for example, the comparator 41 compares the result value val1 with the expected value val2 for each of 32 bits, that is, 8 (burst length) multiplied by 4 (the number of sets). As a result, the comparator 41 performs the comparison 32 times for the supplied 32-bit data.

The comparator 41 compares the result value val1 with the expected value val2 for each bit of the supplied write data WD. If the write data WD contains 32 bits as described in the example above, ALL-PASS signifies that the result value val1 always becomes equal to the expected value val2 in 32 comparison operations.

Similarly, in the following description, ALL-FAIL signifies that the result value val1 always becomes unequal to the expected value val2 in 32 comparison operations. ONE-FAIL signifies that at least one comparison result becomes FAIL and the other comparison results become PASS as a result of 32 comparison operations on a region near the ALL-PASS region. ONE-PASS signifies that at least one comparison result becomes PASS and the other comparison results become FAIL as a result of 32 comparison operations on a region near the ALL-FAIL region.

There has been described the example where the write data WD is supplied as the data signal with burst length 8. However, the mode of supplying the write data WD is not limited thereto. The write data WD can be supplied in any burst length. Any number of sets of data can be supplied. The above-mentioned example is applicable to not only the write data WD but also test data and the read data RD supplied through the same route as that for the write data WD.

Periods D1 and D5 ensure a delay value that always causes an unequal comparison result between the result value val1 and the expected value val2 in all the loopback tests. In other words, all the loopback operations become FAIL if the RDLL 32 is supplied with a delay value within the period D1 or D5.

Periods D2 and D4 ensure a delay value that causes comparison results of PASS and FAIL in loopback tests. That is, loopback operations might become PASS or FAIL if the RDLL 32 is supplied with a delay value within the period D2 or D4. Contingency affects a comparison result during the periods D2 and D4. Signal fluctuation due to jitters mainly causes the contingency.

The left loopback fail value tO provides the maximum delay value in the period D1. The comparator 41 causes the comparison result to be ALL-FAIL if the RDLL 32 is supplied with the left loopback fail value tA as the delay value during the loopback operation. Accordingly, the comparison result of ALL-FAIL is unavailable if the RDLL 32 is supplied with a delay value one step later than the left loopback fail value tA. One step signifies the minimum adjustment division in a delay value supplied to the RDLL 32.

The left loopback slot tB provides the minimum delay value in the period D3. The comparator 41 causes the comparison result to be ALL-PASS if the RDLL 32 is supplied with the left loopback slot tB as the delay value during the loopback operation. Accordingly, the comparison result of ALL-PASS is unavailable if the RDLL 32 is supplied with a delay value one step earlier than the left loopback slot tB.

The right loopback slot tC provides the maximum delay value in the period D3. The comparator 41 causes the comparison result to be ALL-PASS if the RDLL 32 is supplied with the right loopback slot tC as the delay value during the loopback operation. Accordingly, the comparison result of ALL-PASS is unavailable if the RDLL 32 is supplied with a delay value one step earlier than the right loopback slot tC.

The right loopback fail value tD provides the minimum delay value in the period D5. The comparator 41 causes the comparison result to be ALL-FAIL if the RDLL 32 is supplied with the right loopback fail value tD as the delay value during the loopback operation. Accordingly, the comparison result of ALL-FAIL is unavailable if the RDLL 32 is supplied with a delay value one step earlier than the right loopback fail value tD.

The estimated left slot value tE and the estimated right slot value tF will be described. Normal calibration provides the estimated left slot value tE and the estimated right slot value tF. The calibration previously writes test data and reads the written test data. The calibration compares the written test data with the read data to determine the estimated left slot value tE and the estimated right slot value tF.

Specifically, when reading the written test data, the read data latch 11 latches the read test data in synchronization with the delayed read strobe signal RDQS_d supplied from the RDLL 32. The comparison result from the comparator varies with a delay value supplied to the RDLL 32. The calibration always causes the comparison result to be ALL-PASS if the RDLL 32 is supplied with a delay value within the proper range. On the other hand, the comparison might result in FAIL if the RDLL 32 is supplied with a delay value outside the proper range.

The estimated left slot value tE provides the minimum delay value that allows the calibration to result in ALL-PASS. The comparator 41 causes the comparison result to be ALL-PASS if the RDLL 32 is supplied with the estimated left slot value tE as the delay value during the calibration.

The estimated right slot value tF provides the maximum delay value that allows the calibration to result in ALL-PASS. The comparator 41 causes the comparison result to be ALL-PASS if the RDLL 32 is supplied with the estimated right slot value tF as the delay value during the calibration.

The estimated left slot value tE and the estimated right slot value tF indicate the lower limit and the upper limit of delay values capable of properly reading data from the memory device 130. The same also applies to an operation of reading the read data RD. In other words, the estimated left slot value tE and the estimated right slot value tF indicate the lower limit and the upper limit of delay values capable of properly reading the read data RD from the memory device 130.

The read delay value tG will be described. The read delay value tG is calculated based on the estimated left slot value tE and the estimated right slot value tF. According to the embodiment, the read delay value tG is configured to be intermediate between the estimated left slot value tE and the estimated right slot value tF. Therefore, the read data RD can be properly read if the RDLL 32 is supplied with the read delay value tG during reading.

Signaling properties of the semiconductor device 120 are influenced by a state change such as a temperature change in the semiconductor device 120 or the memory device 130. The read delay value tG needs to be adjusted as appropriate in order to continuously read the appropriate read data RD under the environment subject to state changes.

The memory interface circuit 100 determines tA through tD using the loopback test during writing in order to adjust the read delay value tG. The memory interface circuit 100 calculates the estimated left slot value tE and the estimated right slot value tF based on the values tA through tD. The read delay value tG is updated accordingly based on the loopback test during writing.

Figure 3:
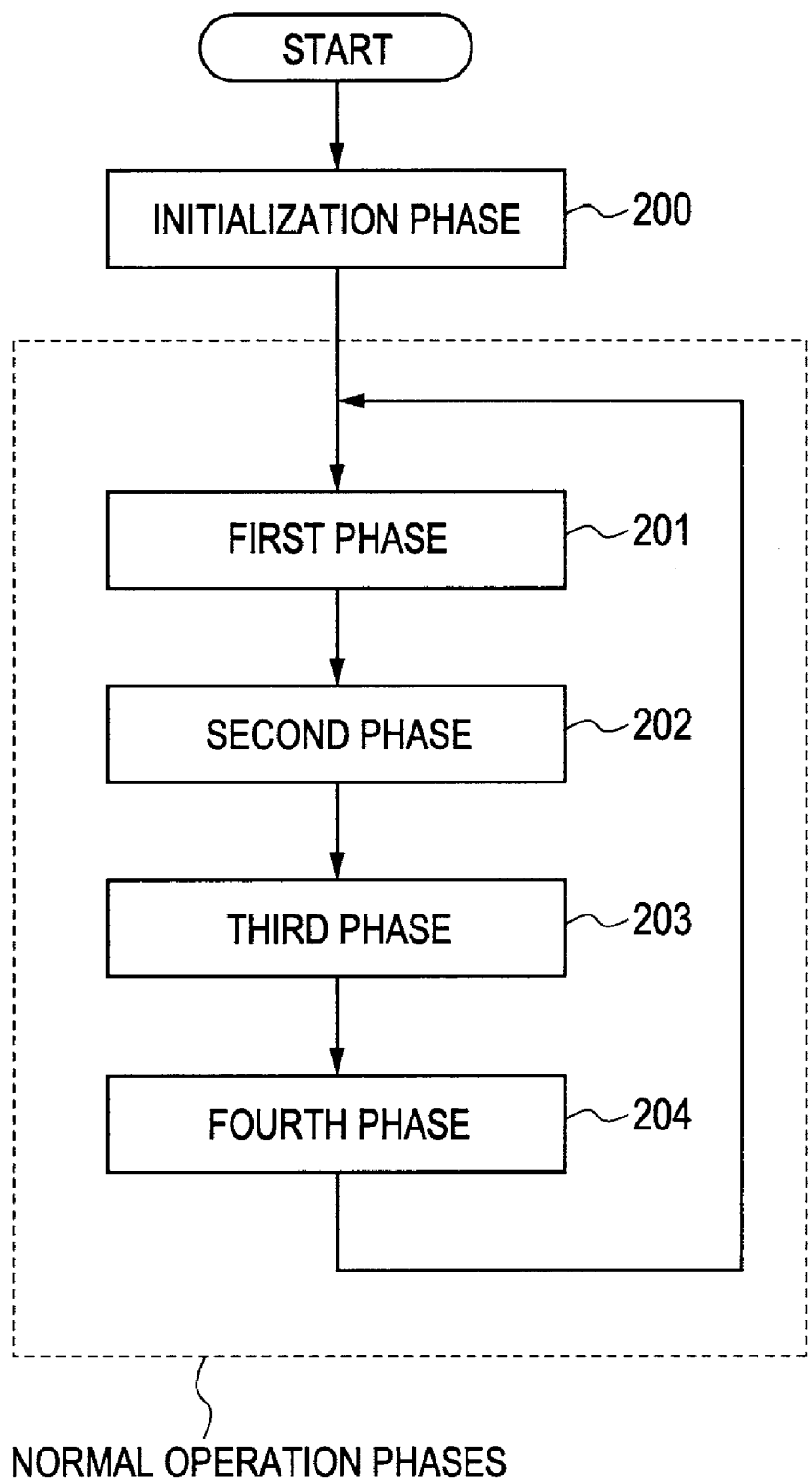
FIG. 3 is a flowchart showing operations of the memory interface circuit according to the first embodiment.

The following describes in detail the method of determining the values tA through tG in the register file. FIG. 3 is a flowchart showing operations of the memory interface circuit 100 according to the first embodiment. As shown in FIG. 3, operations of the memory interface circuit 100 are broadly classified into an initialization phase 200 and normal operation phases (first phase 201 through fourth phase 204). The initialization phase 200 initializes the values tA through tG in the register file. The normal operation phases (first phase 201 through fourth phase 204) write and read normal data. In addition, the normal operation phases (first phase 201 through fourth phase 204) adjust the values tA through tG in the register file during data writing or writing. The first phase 201 through the fourth phase 204 are looped.

Figure 4:
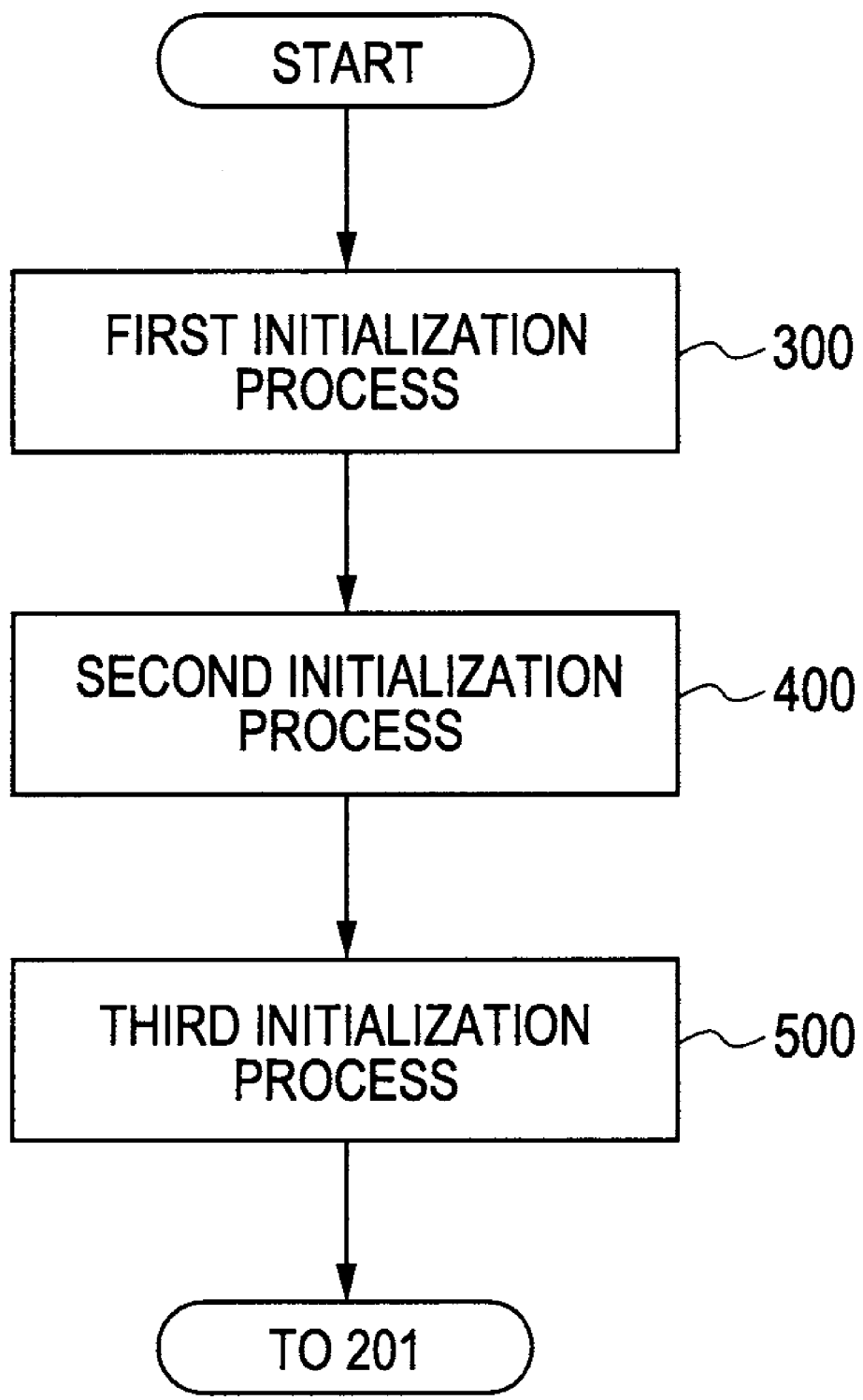
FIG. 4 is a flowchart showing operations in an initialization phase according to the first embodiment.

The initialization phase 200 will be described. FIG. 4 is a flowchart showing operations in the initialization phase 200 according to the first embodiment. As shown in FIG. 4, the initialization phase 200 performs a first initialization process 300, a second initialization process 400, and a third initialization process 500.

Figure 5:
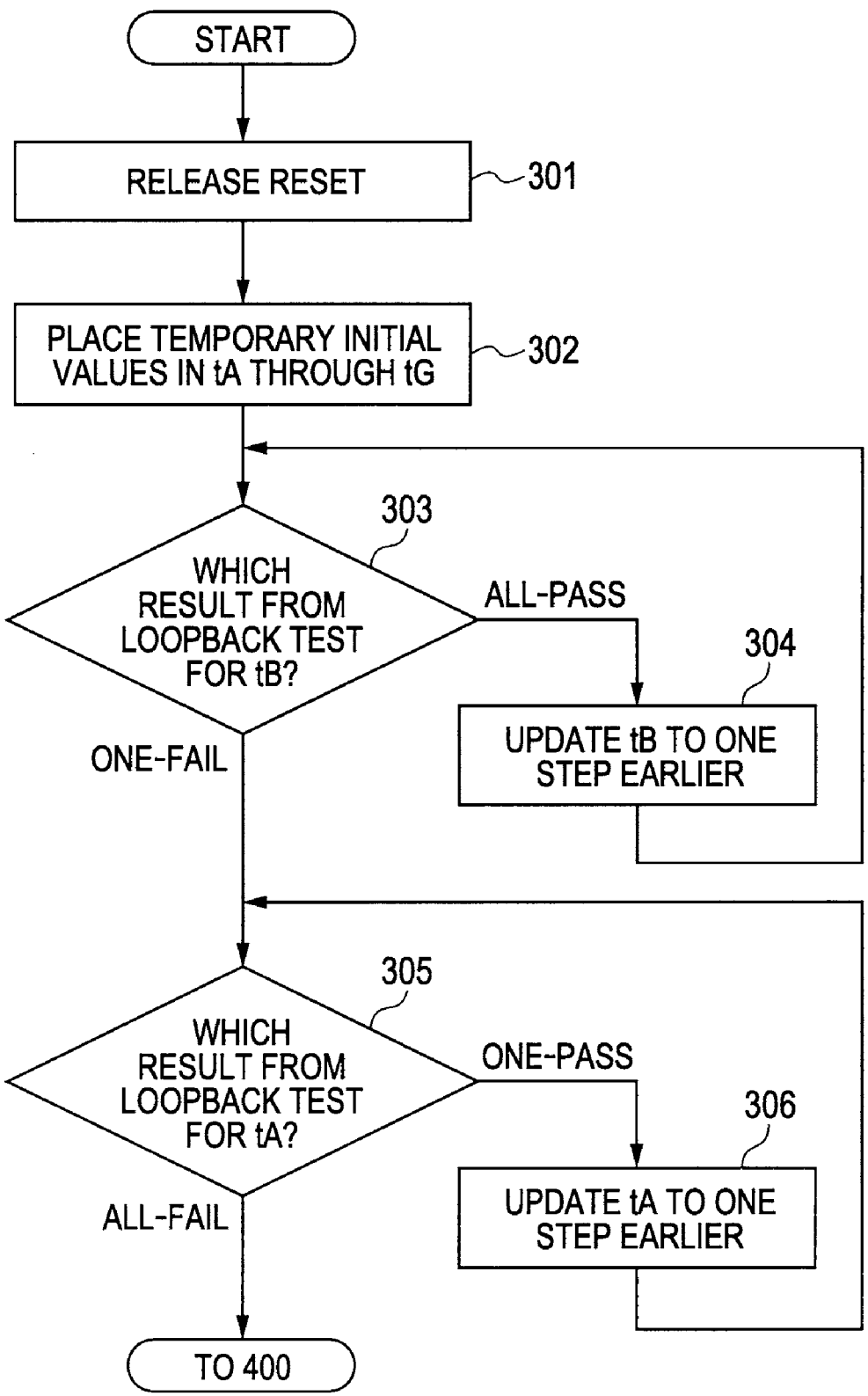
FIG. 5 is a flowchart showing operations in a first initialization process according to the first embodiment.

The first initialization process 300 will be described. FIG. 5 is a flowchart showing operations in the first initialization process 300. The first initialization process 300 supplies initial values for the left loopback fail value tA and the left loopback slot tB. The semiconductor device 120 is reset until the initialization phase 200 starts. In this state, the register control portion 42 waits to be released from the reset state (phase 301).

When the reset state is released, the register control portion 42 supplies temporary initial values for tA through tG to the register file 45 (phase 302). The temporary initial values for tA through tG may be predetermined. Alternatively, the register control portion 42 may determine temporary initial values for tA through tG in accordance with the input delay control signal DCS. Thereafter, a first buffer control signal SB1 enables the write data output buffer 21 and the strobe signal output buffer 23. A second buffer control signal SB2 enables the read data input buffer 22 and the strobe signal input buffer 24. The write data output buffer 21, the read data input buffer 22, the strobe signal output buffer 23, and the strobe signal input buffer 24 remain enabled across the first initialization process 300 and the second initialization process 400.

Control is then passed to a process that supplies an initial value for the left loopback slot tB. The register control portion 42 operates the delay selection portion 44 in accordance with the delay control signal DCS, reads the temporary initial value for the left loopback slot tB from the register file 45, and assumes the temporary initial value to be a delay value for the RDLL 32. The external circuit 110 supplies test data through the write data signal line 51. Similarly to the write data WD or the read data RD, the test data is supplied as burst data with a specified burst length. The test data is supplied as N sets of successively supplied burst data, where N is 2 or larger integer. The test data is looped back to the read data latch 11 through the write data output buffer 21 and the read data input buffer 22. At the same time, the test data is also supplied to the expected value acquisition latch 12. That is, the loopback test is performed while the left loopback slot tB is set to the RDLL 32.

The read data latch 11 latches the looped-back test data in synchronization with the delayed read strobe signal RDQS_d from the RDLL 32. The read data latch 11 outputs the latched data as the result value val1 to the comparator 41.

The expected value acquisition latch 12 latches the test data in synchronization with the clock signal CLK. The expected value acquisition latch 12 outputs the latched data as the expected value val2 to the comparator 41.

The comparator 41 compares the result value val1 with the expected value val2. The comparator 41 repeats the comparison N times on the N sets of burst data and outputs N comparison results. The number of repetitions N may be defined as any value as far as the value can reflect the instability of a comparison result due to jitter components (phase 303).

The register control portion 42 evaluates a comparison result from the comparator 41. If the comparison repeated N times results in ALL-PASS, the register control portion 42 updates the value of the left loopback slot tB in the register file 45 to a value one step earlier than the temporary initial value (phase 304). Control returns to phase 303 after the value of the left loopback slot tB is updated. At phase 303, the register control portion 42 assumes the updated value of the left loopback slot tB to be the delay value for the RDLL 32. Phases 303 and 304 are repeated until the register control portion 42 finds a delay value that causes at least one of N comparison results to be FAIL. It is possible to provide the minimum delay value in the period D3 as an initial value for the left loopback slot tB.

The temporary initial value for the left loopback slot tB might cause a comparison result of ONE-FAIL. In this case, it can be assumed that the temporary initial value for the left loopback slot tB is set to be too early. As a workaround, the temporary initial value for the left loopback slot tB is set to be later and the first initialization process 300 is performed again. It is possible to set an appropriate initial value for the left loopback slot tB.

There might be a case where the comparison only results in ALL-PASS even if the value of the left loopback slot tB is set back to the minimum available value for the RDLL 32. In this case, the minimum available value for the RDLL 32 can be supplied as a value for the left loopback slot tB. The first initialization process 300 can be performed again by changing the number of repetitions or test data.

Control is then passed to a process that supplies an initial value for the left loopback fail value tA. The register control portion 42 operates the delay selection portion 44 in accordance with the delay control signal DCS, reads the temporary initial value for the left loopback fail value tA from the register file 45, and assumes the temporary initial value to be a delay value for the RDLL 32. In this state, the comparator 41 compares N sets of successively supplied burst data (test data) similarly to phase 303 (phase 305). That is, the loopback test is performed while the left loopback fail value tA is set to the RDLL 32.

The register control portion 42 evaluates a comparison result from the comparator 41. If at least one of N comparison operations results in PASS, the register control portion 42 updates the value of the left loopback fail value tA in the register file 45 to a value one step earlier than the temporary initial value (phase 306). Control returns to phase 305 after the value of the left loopback fail value tA is updated. At phase 305, the register control portion 42 assumes the updated value of the left loopback fail value tA to be the delay value for the RDLL 32. Phases 305 and 306 are repeated until the register control portion 42 finds a delay value that causes N comparison results to be ALL-FAIL. It is possible to provide the maximum delay value in the period D1 for the left loopback fail value tA.

Figure 6:
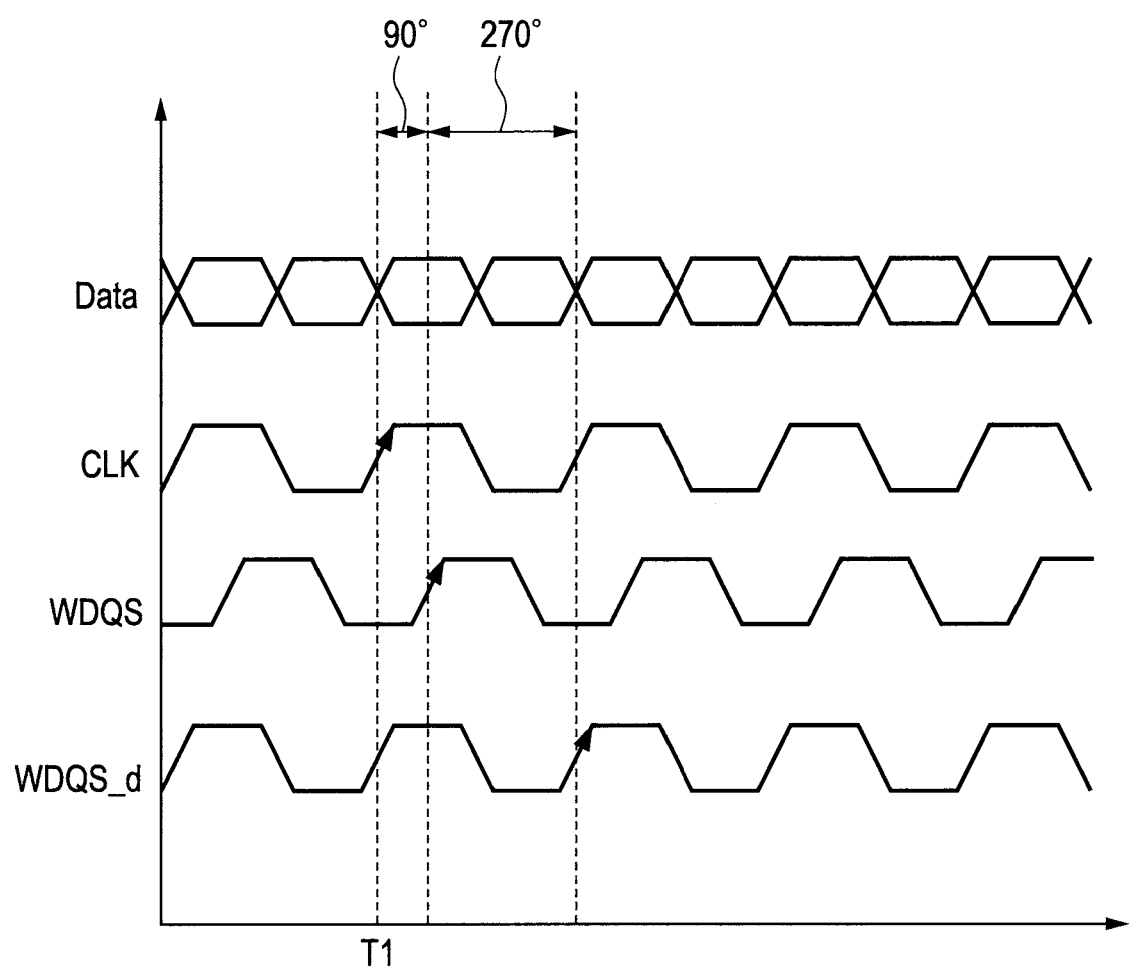
FIG. 6 is a timing chart exemplifying signal timings in the first initialization process according to the first embodiment.

The following describes a delay value specified for the RDLL 32 in the first initialization process 300. The read data latch 11 is assumed to latch test data looped back at the timing (rising or falling) for transition of the delayed write strobe signal WDQS_d. FIG. 6 is a timing chart exemplifying signal timings in the first initialization process 300. Basically, it is necessary to search the vicinity of a rising timing T1 for the clock signal CLK in order to settle initial values for the left loopback fail value tA and the left loopback slot tB. However, the RDLL 32 delays the write strobe signal WDQS to generate the delayed write strobe signal WDQS_d. The WDLL 31 provides the write strobe signal WDQS with a delay of 90 degrees from the clock signal CLK. It is physically impossible for the RDLL 32 to set back the phase of the write strobe signal WDQS. No search is available around the timing T1 under the existing conditions.

As a workaround, the RDLL 32 greatly delays the phase of the write strobe signal WDQS and generates the delayed write strobe signal WDQS_d approximately one cycle later than the clock signal CLK. The delayed write strobe signal WDQS_d can rise at around the timing T1. As a result, the read data latch can latch the looped-back test data (Data in FIG. 6) at around the timing T1. The left loopback fail value to and the left loopback slot tB each have a relatively large value such as approximately 270 degrees.

Figure 7:
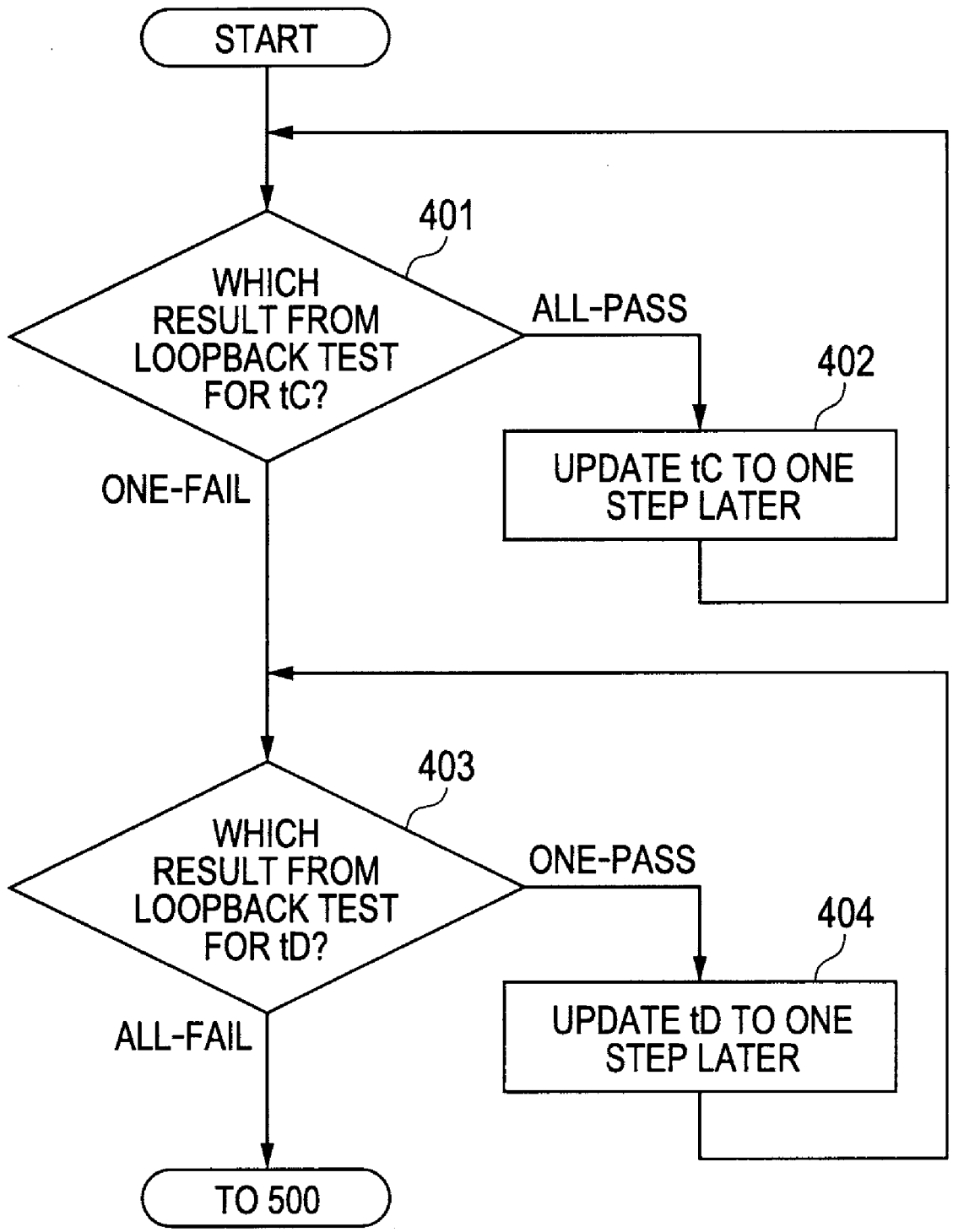
FIG. 7 is a flowchart showing operations in a second initialization process according to the first embodiment.

The second initialization process 400 will be described. FIG. 7 is a flowchart showing operations in the second initialization process 400. Control is first passed to a process that sets an initial value for the right loopback slot tC. The register control portion 42 operates the delay selection portion 44 in accordance with the delay control signal DCS, reads the temporary initial value for the right loopback slot tC from the register file 45, and assumes the temporary initial value to be a delay value for the RDLL 32. In this state, the comparator 41 compares N sets of successively supplied burst data (test data) similarly to phase 303 of the first initialization process 300 (phase 401). That is, the loopback test is performed while the right loopback slot tC is set to the RDLL 32.

The register control portion 42 evaluates a comparison result from the comparator 41. If N comparison operations result in ALL-PASS, the register control portion 42 updates the value of the right loopback slot tC in the register file 45 to a value one step later than the temporary initial value (phase 402). Control returns to the phase 401 after the value of the right loopback slot tC is updated. At phase 401, the register control portion 42 assumes the updated value of the right loopback slot tC to be the delay value for the RDLL 32. Phases 401 and 402 are repeated until the register control portion 42 finds a delay value that causes N comparison results to be ONE-FAIL. It is possible to provide the maximum delay value in the period D3 for the right loopback slot tC.

The temporary initial value for the right loopback slot tC might cause a comparison result of ONE-FAIL. In this case, it can be assumed that the temporary initial value for the right loopback slot tC is set to be too late. As a workaround, the temporary initial value for the right loopback slot tC is set to be earlier and the second initialization process 400 is performed again. It is possible to determine an appropriate initial value for the right loopback slot tC.

Control is then passed to a process that supplies an initial value for the right loopback fail value tD. The register control portion 42 operates the delay selection portion 44 in accordance with the delay control signal DCS, reads the temporary initial value for the right loopback fail value tD from the register file 45, and assumes the temporary initial value to be a delay value for the RDLL 32. In this state, the comparator 41 compares N sets of successively supplied burst data (test data) similarly to phase 401 (phase 403). That is, the loopback test is performed while the right loopback fail value tD is set to the RDLL 32.

The register control portion 42 evaluates a comparison result from the comparator 41. If N comparison operations result in ONE-PASS, the register control portion 42 updates the value of the right loopback fail value tD in the register file 45 to a value one step later than the temporary initial value (phase 404). Control returns to phase 403 after the value of the right loopback fail value tD is updated. At phase 403, the register control portion 42 assumes the updated value of the right loopback fail value tD to be the delay value for the RDLL 32. Phases 403 and 404 are repeated until the register control portion 42 finds a delay value that causes N comparison results to be ALL-FAIL. It is possible to provide the maximum delay value in the period D5 for the right loopback fail value tD.

Figure 8:
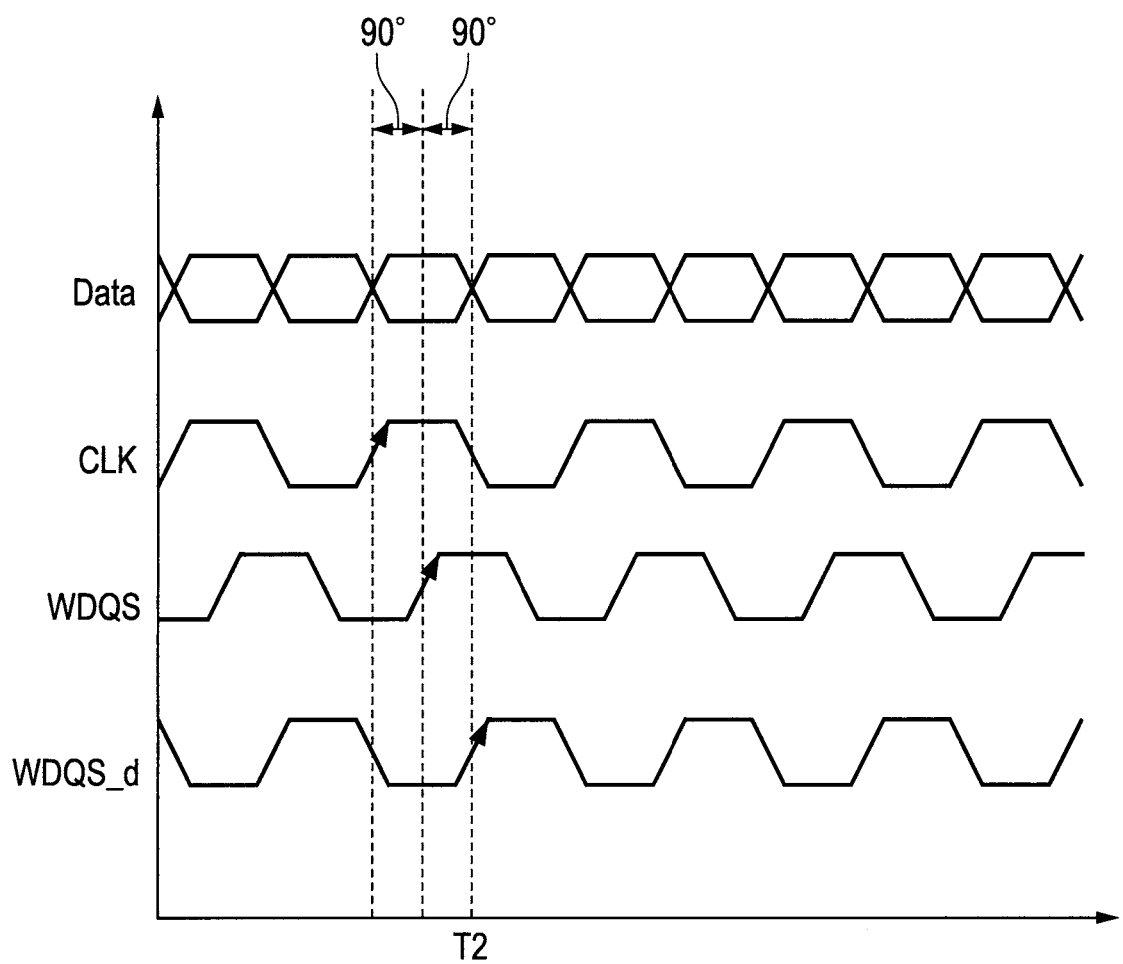
FIG. 8 is a timing chart exemplifying signal timings in the second initialization process according to the first embodiment.

The following describes a delay value specified for the RDLL 32 in the second initialization process 400. The read data latch 11 is assumed to latch test data looped back at the timing (rising or falling) for transition of the delayed write strobe signal WDQS_d. FIG. 8 is a timing chart exemplifying signal timings in the second initialization process 400. Basically, as shown in FIG. 8, it is necessary to search the vicinity of a rising timing T2 for the clock signal CLK in order to settle initial values for the right loopback slot tC and the right loopback fail value tD. However, the RDLL 32 delays the write strobe signal WDQS to generate the delayed write strobe signal WDQS_d. The WDLL 31 provides the write strobe signal WDQS with a delay of 90 degrees from the clock signal CLK. The delayed write strobe signal WDQS_d can rise at around the timing T2 if the RDLL 32 further delays the phase of the write strobe signal WDQS. As a result, the read data latch 11 can latch the looped-back test data (Data in FIG. 8) at around the timing T2.

The right loopback slot tC and the right loopback fail value tD each have a value of approximately 90 degrees. According to the configuration, values of the right loopback slot tC and the right loopback fail value tD are smaller than those of the left loopback fail value to and the left loopback slot tB.

Figure 9:
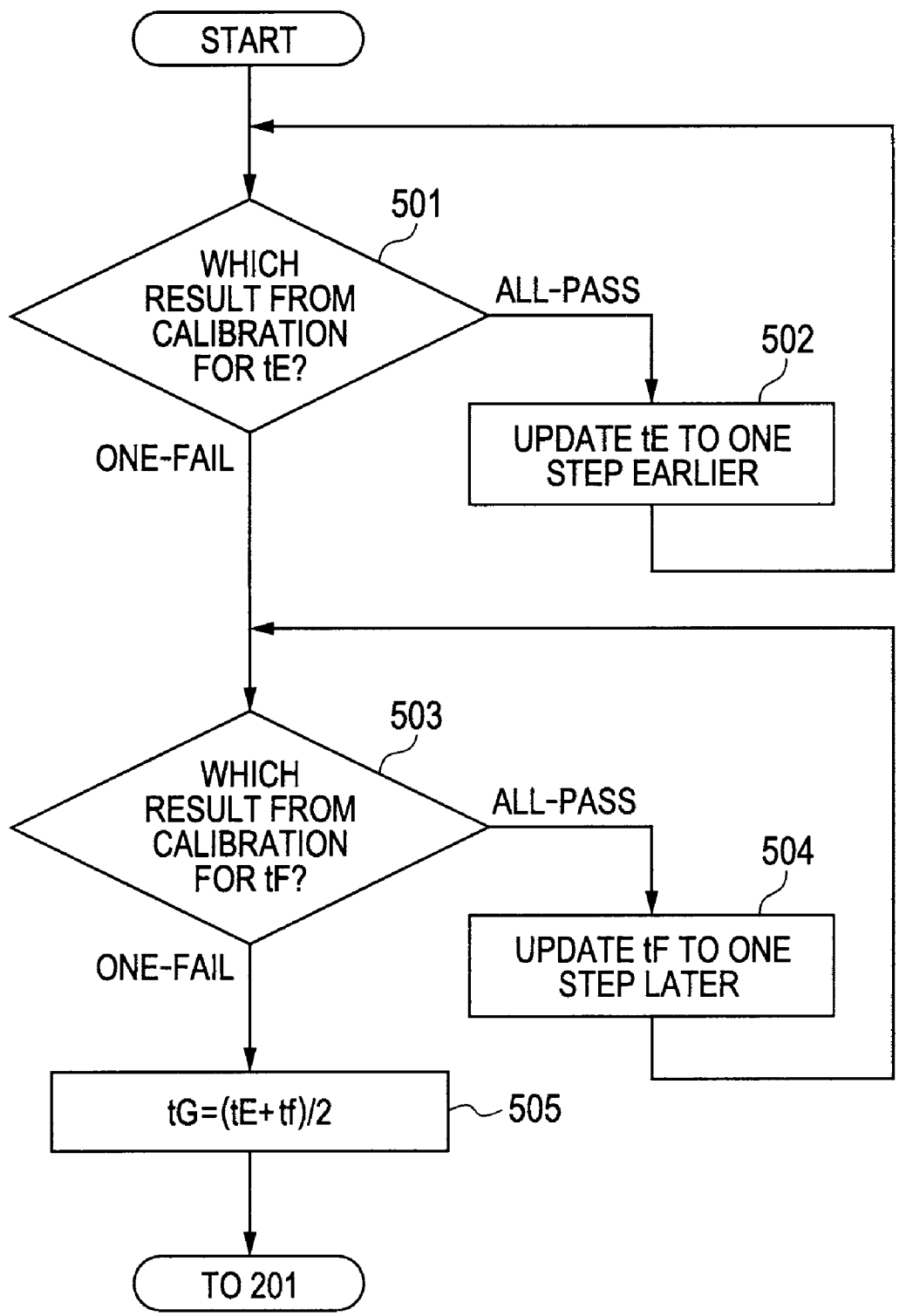
FIG. 9 is a flowchart showing operations in a third initialization process according to the first embodiment.

The third initialization process 500 will be described. FIG. 9 is a flowchart showing operations in the third initialization process 500. The third initialization process 500 writes test data supplied from the external circuit 110 to the memory device 130. The data to be written is previously latched as an expected value. The written data is then read. The read data is latched so that it is compared with the expected value. The comparator 41 compares the two pieces of latched data with each other.

Control is then passed to a process that supplies an initial value for the estimated left slot value tE. The semiconductor device 120 writes the test data. The first buffer control signal SB1 enables the write data output buffer 21 and the strobe signal output buffer 23. The second buffer control signal SB2 disables the read data input buffer 22 and the strobe signal input buffer 24.

The external circuit 110 outputs the test data to the write data output buffer 21. The test data is written to the memory device 130 in accordance with the write strobe signal WDQS supplied through a strobe signal line 72. At the same time, the test data is also supplied to the expected value acquisition latch 12. The expected value acquisition latch 12 latches the test data as the expected value val2 in synchronization with the clock signal CLK.

The semiconductor device 120 then reads the test data. The second buffer control signal SB2 enables the read data input buffer 22 and the strobe signal input buffer 24. The first buffer control signal SB1 disables the write data output buffer 21 and the strobe signal output buffer 23.

The register control portion 42 operates the delay selection portion 44 in accordance with the delay control signal DCS, reads the temporary initial value for the estimated left slot value tE from the register file 45, and assumes the temporary initial value to be a delay value for the RDLL 32. the memory interface circuit is supplied with the test data written to the memory device 130 through the data signal line 71. Similarly to the read data RD, the test data is supplied as burst data having a specified burst length. The test data is supplied as N sets of successively supplied burst data.

The read test data is supplied to the read data latch 11 through the read data input buffer 22. The read data latch 11 latches the read test data as the result value val1 in synchronization with the delayed read strobe signal RDQS_d supplied from the RDLL 32.

The comparator 41 compares the result value val1 with the expected value val2. The comparator 41 repeats the comparison N times on the N sets of test data and outputs N comparison results (phase 501).

If the comparison repeated N times results in ALL-PASS, the register control portion 42 updates the value of the estimated left slot value tE in the register file 45 to a value one step earlier than the temporary initial value (phase 502). Control returns to the phase 501 after the value of the estimated left slot value tE is updated. At phase 501, the register control portion 42 assumes the updated value of the estimated left slot value tE to be the delay value for the RDLL 32. Phases 501 and 502 are repeated until the register control portion 42 finds a delay value that causes N comparison results to be ONE- FAIL. It is possible to provide the minimum delay value in the period D3 for the estimated left slot value tE.

The temporary initial value for the estimated left slot value tE might cause a comparison result of ONE-FAIL. In this case, the same workaround as described for the right loopback slot tC may be used. That is, the temporary initial value for the estimated left slot value tE is set to be earlier. The third initialization process 500 is performed again. It is possible to determine an appropriate initial value for the estimated left slot value tE.

Control is then passed to a process that supplies an initial value for the estimated right slot value tF. The register control portion 42 controls the delay selection portion 44 to supply the RDLL 32 with the temporary initial value for the estimated right slot value tF in the register file 45. In this state, the comparator 41 compares N sets of successively supplied test data similarly to phase 501 (phase 503).

If N comparison operations result in ALL-PASS, the register control portion 42 updates the value of the estimated right slot value tF in the register file 45 to a value one step later than the temporary initial value (phase 504). Control returns to the phase 503 after the value of the estimated right slot value tF is updated. The register control portion 42 then assumes the updated value of the estimated right slot value tF to be the delay value for the RDLL 32. Phases 503 and 504 are repeated until the register control portion 42 finds a delay value that causes N comparison results to be ONE-FAIL. It is possible to provide the maximum delay value in the period D3 for the estimated right slot value tF.

The register control portion 42 then calculates an initial value for the read delay value tG to be used for a normal read operation (phase 505). The read delay value tG to be calculated is expressed by the following equation (1).

$$tG=(tE+tF)/2 \quad (1)$$

The initialization phase 200 has been completed. The initial values are specified for the values to through tG in the register file 45.

The following describes a delay value specified for the RDLL 32 in the third initialization process 500. The estimated left slot value tE is configured to be relatively large similarly to the first initialization process 300. The estimated right slot value tF is configured to be smaller than the estimated left slot value tE similarly to the second initialization process 400.

The following describes the normal operation phases (first phase 201 through fourth phase 204). The first phase 201 through the fourth phase 204 are looped. The description below applies immediately after completion of the initialization phase 200 for simplicity.

Figure 10:
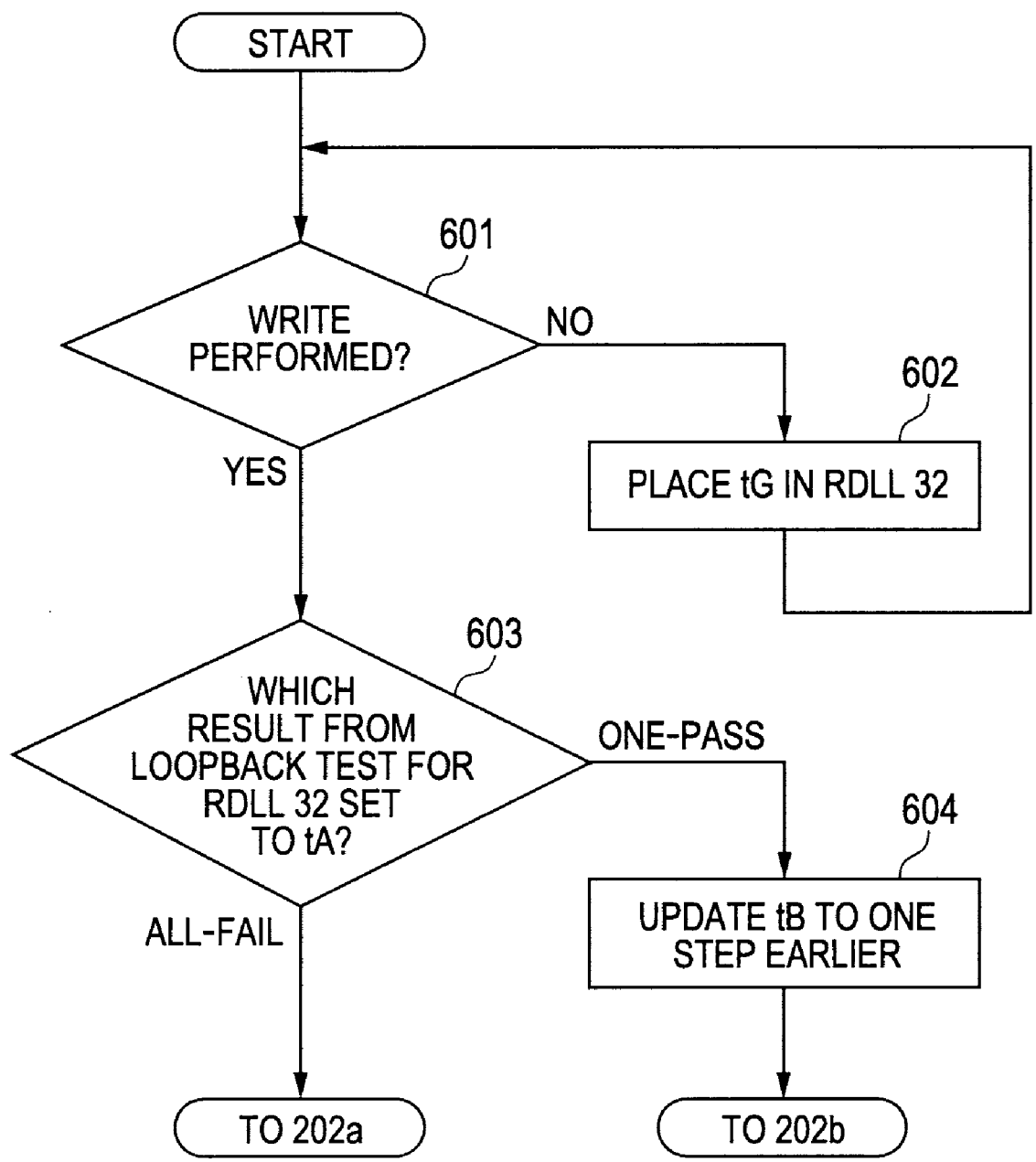
FIG. 10 is a flowchart showing operations in a first phase according to the first embodiment.

The first phase 201 will be described. FIG. 10 is a flowchart showing operations in the first phase 201. The external circuit 110 determines whether the semiconductor device 120 is requested to perform a write operation (phase 601). The external circuit 110 transfers a determination result to the register control portion 42 using the delay control signal DCS.

The register control portion 42 controls the delay selection portion 44 to supply the RDLL 32 with an initial value for the read delay value tG if it is determined that the semiconductor device 120 is not requested to perform a write operation, that is, during reading. Therefore, the RDLL 32 provides the read data RD with a delay corresponding to the initial value for the read delay value tG (phase 602). A normal read operation is performed using the read delay value tG.

On the other hand, a loopback test is performed if it is determined that the semiconductor device 120 is requested to perform a write operation, that is, during writing. The register control portion 42 controls the delay selection portion 44 to supply the RDLL 32 with an initial value for the left loopback fail value to in the register file 45. The first buffer control signal SB1 enables the write data output buffer 21 and the strobe signal output buffer 23. The second buffer control signal SB2 enables the read data input buffer 22 and the strobe signal input buffer 24. The write data output buffer 21, the read data input buffer 22, the strobe signal output buffer 23, and the strobe signal input buffer 24 remain enabled during writing at the first phase 201 through the fourth phase 204.

The external circuit 110 supplies the write data WD to the memory interface circuit 100. The write data WD is written to the memory device 130 and is latched as the expected value val2 by the expected value acquisition latch 12. The write data WD is looped back to the read data latch 11. The looped-back read data RD is latched as the result value val1. The comparator 41 compares the result value val1 with the expected value val2. The comparator 41 repeats the comparison on multiple pieces of write data (phase 603).

The register control portion 42 references the comparison result. The comparison result may be assumed to be ALL-FAIL since the RDLL 32 is supplied with the initial value for the left loopback fail value tA. However, the comparison might result in ONE-PASS instead of ALL-FAIL due to a variation in characteristics or jitters of the semiconductor device 120. The above-mentioned assumption is negated if the comparison results in ONE-PASS. Further, the comparison might result in ONE-PASS if no change is detected in the write data WD. Also in this case, the above-mentioned assumption is negated.

There might be a case where the above-mentioned assumption is negated. In this case, the left loopback fail value tA may be considered to shift to a value earlier than the initial value due to a variation in the characteristics of the semiconductor device 120. As a result, the left loopback slot tB may be also considered to shift to a value earlier than the initial value similarly. If the comparison results in ONE-PASS, the register control portion 42 updates the left loopback slot tB to a value one step earlier (phase 604). Control then proceeds to step 202b of the second phase 202 in order to confirm whether the left loopback slot tB is valid.

If the comparison results in ALL-FAIL according to the above-mentioned assumption, the register control portion 42 maintains the left loopback fail value to and the left loopback slot tB unchanged. Control then proceeds to step 202a of the second phase 202.

Figure 11:
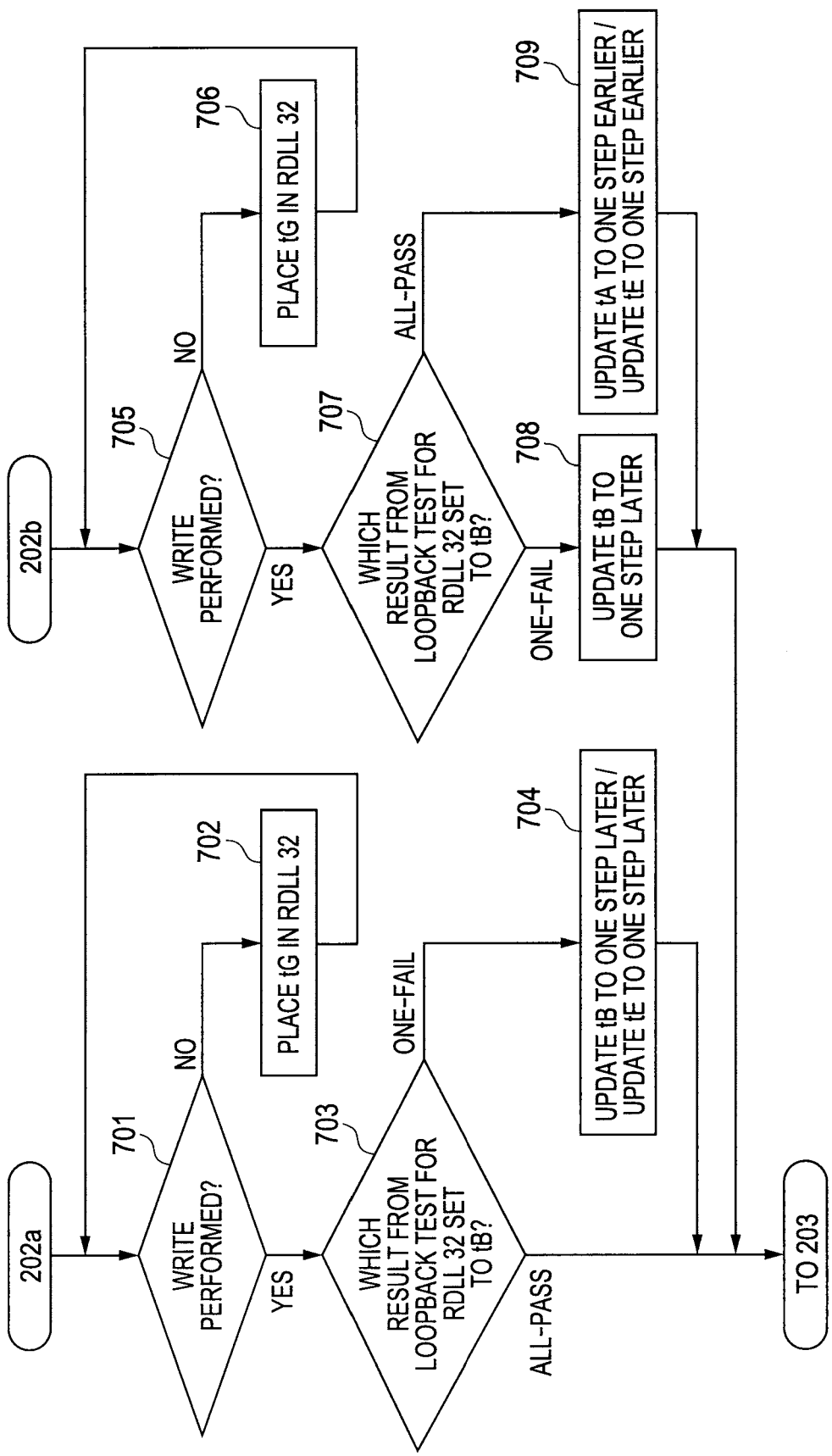
FIG. 11 is a flowchart showing operations in a second phase according to the first embodiment.

The second phase 202 will be described. FIG. 11 is a flowchart showing operations in the second phase 202. The following describes phases 701 through 704 starting from step 202a where the assumption in the first phase 201 is correct. The phases 701 and 702 are equal to the phases 601 and 602 and a description is omitted.

A loopback test is performed if it is determined that the semiconductor device 120 is requested to perform a write operation, that is, during writing. The register control portion 42 controls the delay selection portion 44 to supply the RDLL 32 with the initial value for the left loopback slot tB maintained in the first phase 201 as is. The first buffer control signal SB1 enables the write data output buffer 21 and the strobe signal output buffer 23. The second buffer control signal SB2 enables the read data input buffer 22 and the strobe signal input buffer 24.

At the same time, the external circuit 110 supplies the write data WD to the memory interface circuit 100. The write data WD is written to the memory device 130 and is latched as the expected value val2 by the expected value acquisition latch 12. The write data WD is looped back to the read data latch 11.

The looped-back read data RD is latched as the result value val1. The comparator 41 compares the result value val1 with the expected value val2. The comparator 41 repeats the comparison on multiple pieces of write data (phase 703).

The register control portion 42 references the comparison result. The RDLL 32 is supplied with the initial value for the left loopback slot tB. Therefore, the comparison result from the comparator 41 may be assumed to be ALL-PASS. However, the comparison might result in ONE-FAIL instead of ALL-PASS due to a variation in characteristics or jitters of the semiconductor device 120. The above-mentioned assumption is negated if the comparison results in ONE-FAIL.

There might be another case where the above-mentioned assumption is negated. In this case, the left loopback slot tB may be considered to shift to a value later than the initial value due to a variation in the characteristics of the semiconductor device 120. As a result, the estimated left slot value tE may be also considered to shift to a value later than the initial value similarly. If the comparison results in ONE-FAIL, the left loopback slot tB is updated to a value one step later. The left loopback slot tB is determined in this manner. It is possible to suppose that the estimated left slot value tE also varies with the left loopback slot tB. Accordingly, the estimated left slot value tE is also updated to a value one step later (phase 704).

The loopback test results in ALL-FAIL on the left loopback fail value tA at phase 603 in the first phase 201. The left loopback fail value tA is assumed to be correct and is maintained as is. The normal operation phase can be repeated to correct the left loopback fail value tA even if it is shifted to an earlier value. That is, the procedure is repeated from phase 603, step 202a, phase 701, phase 703, and then to phase 704. As a result, the left loopback slot tB results in ALL-PASS at phase 703. The normal operation phase can be repeated to correct the left loopback fail value tA even if it is shifted to a later value. That is, the procedure is repeated from phase 603, phase 604, step 202b, phase 705, phase 707, and then to phase 709. As a result, the left loopback fail value tA results in ALL-PASS at phase 603. The effect of repeating the normal operation phase is unchanged even if the left loopback fail value tA is delayed one step at phase 704 in relation to the left loopback slot tB.

The left loopback fail value tA, the left loopback slot tB, and the estimated left slot value tE are maintained unchanged if the comparison results in ALL-PASS according to the above-mentioned assumption. Control then proceeds to the third phase 203.

The following describes phases 705 through 709 starting from step 202b where the assumption in the first phase 201 is incorrect. The phases 705 and 706 are equal to the phases 601 and 602 and a description is omitted.

A loopback test is performed if it is determined that the semiconductor device 120 is requested to perform a write operation, that is, during writing. The register control portion 42 controls the delay selection portion 44 to supply the RDLL 32 with the initial value for the left loopback slot tB in the register file 45. The value supplied to the left loopback slot tB is one step earlier than the initial value at the first phase. Similarly to the phase 703, the write data output buffer 21, the read data input buffer 22, the strobe signal output buffer 23, and the strobe signal input buffer 24 are enabled.

At the same time, the external circuit 110 supplies the write data WD to the memory interface circuit 100. The write data WD is written to the memory device 130 and is latched as the expected value val2 by the expected value acquisition latch 12. The write data WD is looped back to the read data latch 11. The looped-back read data RD is latched as the result value val1. The comparator 41 compares the result value val1 with the expected value val2. The comparator 41 repeats the comparison on multiple pieces of write data (phase 707).

The register control portion 42 references the comparison result. The RDLL 32 is supplied with the left loopback slot tB one step earlier than the initial value. Therefore, the comparison result may be assumed to be ALL-PASS. However, the comparison might result in ONE-FAIL instead of ALL-PASS due to a variation in characteristics or jitters of the semiconductor device 120. The above-mentioned assumption is negated if the comparison results in ONE-FAIL.

There might be still another case where the above-mentioned assumption is negated. In this case, the left loopback slot tB can be assumed to be earlier than the value that should be specified originally. That is, the first phase 201 sets the left loopback slot tB one step earlier under the influence of contingency due to jitters and therefore may be considered to be invalid. To cancel the process at the first phase 201, the register control portion 42 updates the left loopback slot tB to a value one step later. Consequently, the left loopback slot tB is returned to the initial value (phase 708).

The assumption at the first phase 201 might be also considered to be incorrect if no change is detected in the write data WD as described above. Also in this case, to cancel the process at the first phase 201, the register control portion 42 updates the left loopback slot tB to a value one step later. It is also possible to correct insufficient assumption caused by the write data WD.

There might be a case where the above-mentioned assumption is correct. In this case, it may be considered valid that the first phase 201 adjusted the left loopback slot tB one step earlier. The left loopback fail value to and the estimated left slot value tE are updated to values one step earlier in accordance with the process of adjusting the left loopback slot tB one step earlier (phase 709). As a result, the left loopback fail value tA, the left loopback slot tB, and the estimated left slot value tE can be set to proper values.

Figure 12:
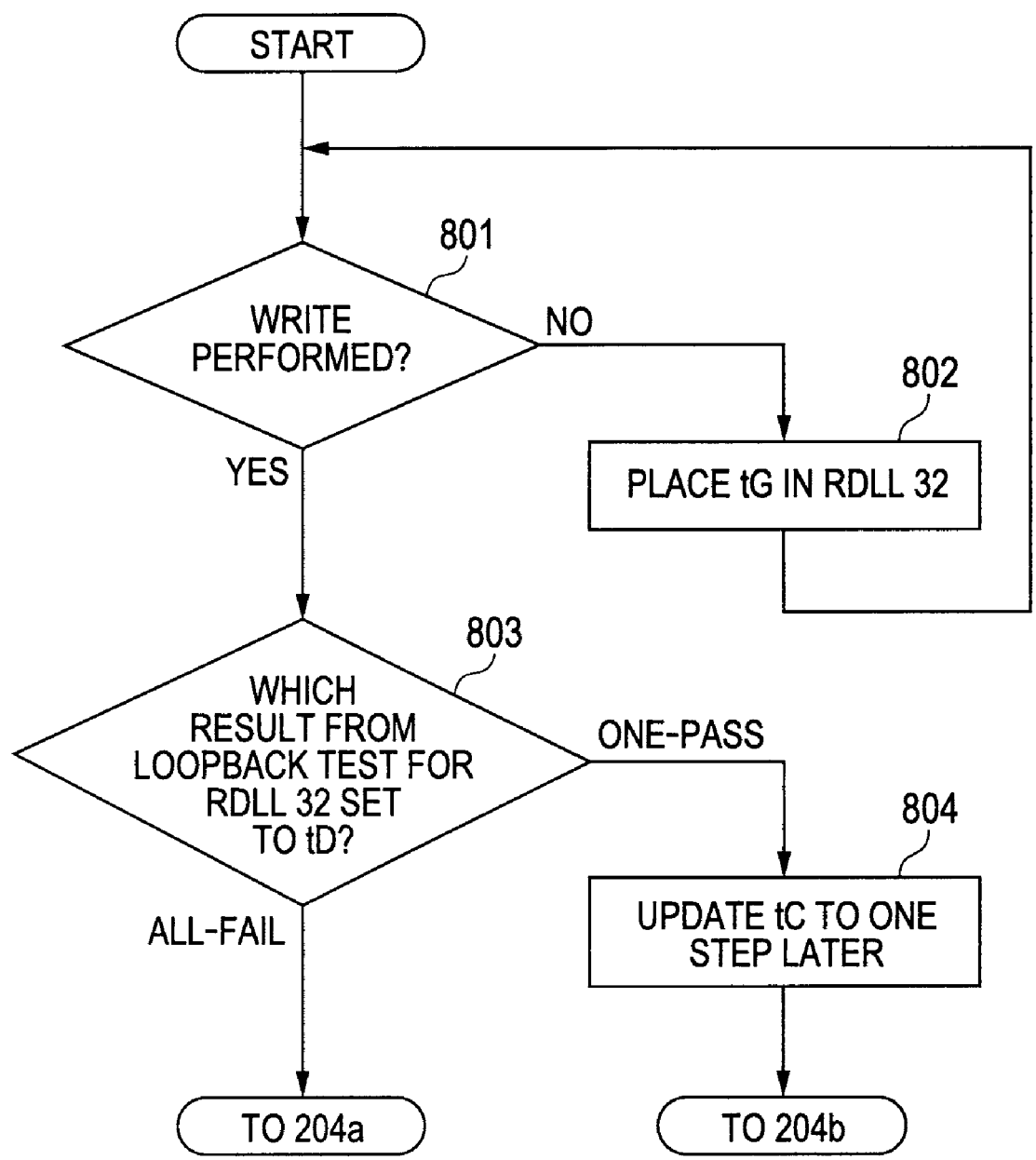
FIG. 12 is a flowchart showing operations in a third phase according to the first embodiment.

The third phase 203 will be described. FIG. 12 is a flowchart showing operations in the third phase 203. The phases 801 and 802 are equal to the phases 601 and 602 and a description is omitted.

A loopback test is performed if it is determined that the semiconductor device 120 is requested to perform a write operation, that is, during writing. The register control portion 42 controls the delay selection portion 44 to supply the RDLL 32 with the initial value for the right loopback fail value tD. The first buffer control signal enables the write data output buffer 21 and the strobe signal output buffer 23. The second buffer control signal enables the read data input buffer 22 and the strobe signal input buffer 24.

At the same time, the external circuit 110 supplies the write data WD to the memory interface circuit 100. The write data WD is written to the memory device 130 and is latched as the expected value val2 by the expected value acquisition latch 12. The write data WD is looped back to the read data latch 11. The looped-back read data RD is latched as the result value val1. The comparator 41 compares the result value val1 with the expected value val2. The comparator 41 repeats the comparison on multiple pieces of write data (phase 803).

The register control portion 42 references the comparison result. The RDLL 32 is supplied with the initial value for the right loopback fail value tD. Therefore, the comparison result from the comparator 41 may be assumed to be ALL-FAIL. However, the comparison might result in ONE-PASS instead of ALL-FAIL due to a variation in characteristics or jitters of the semiconductor device 120. The above-mentioned assumption is negated if the comparison results in ONE-PASS. The comparison might also result in ONE-PASS if no change is detected in the write data WD. The above-mentioned assumption is also negated in this case.

There might be yet another case where the above-mentioned assumption is negated. In this case, the right loopback fail value tD may be considered to shift to a value later than the initial value due to a variation in the characteristics of the semiconductor device 120. As a result, the right loopback slot tC may be also considered to shift to a value later than the initial value similarly. If the comparison results in ONE-PASS, the right loopback slot tC is updated to a value one step later (phase 804). Control then proceeds to step 204b of the fourth phase 204 in order to confirm whether the right loopback fail value tD is value.

The right loopback fail value tD is maintained as the initial value if the comparison results in ALL-FAIL in accordance with the assumption. Control then proceeds to step 204a of the fourth phase 204.

Figure 13:
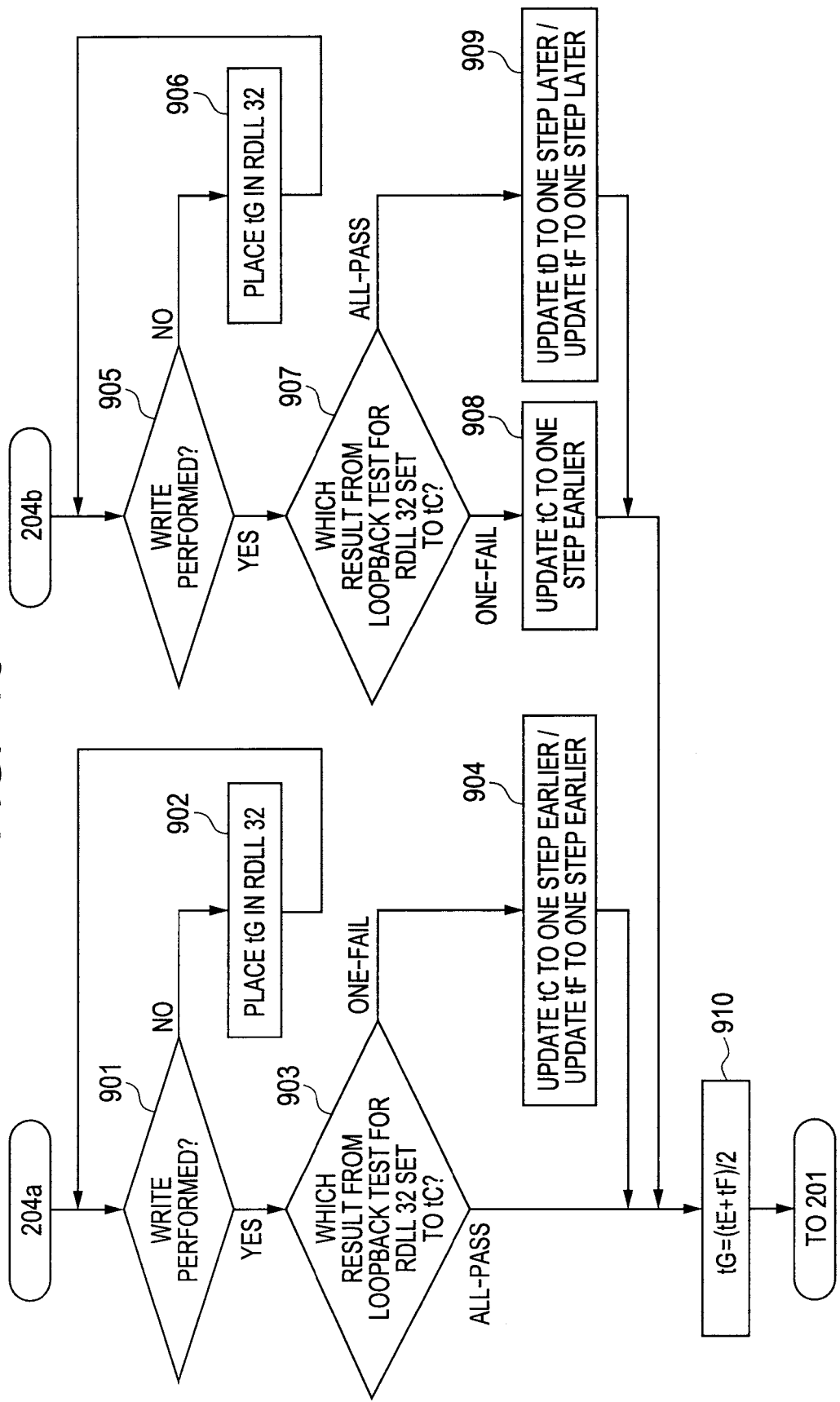
FIG. 13 is a flowchart showing operations in a fourth phase according to the first embodiment.

The fourth phase 204 will be described. FIG. 13 is a flowchart showing operations in the fourth phase 204. The following describes phases 901 through 904 starting from step 204a where the assumption in the third phase 203 is incorrect. The phases 901 and 902 are equal to the phases 601 and 602 and a description is omitted.

A loopback test is performed if it is determined that the semiconductor device 120 is requested to perform a write operation, that is, during writing. The register control portion 42 controls the delay selection portion 44 to supply the RDLL 32 with the initial value for the right loopback slot tC maintained as is in the third phase 203. The first buffer control signal SB1 enables the write data output buffer 21 and the strobe signal output buffer 23. The second buffer control signal SB2 enables the read data input buffer 22 and the strobe signal input buffer 24.

At the same time, the external circuit 110 supplies the write data WD to the memory interface circuit 100. The write data WD is written to the memory device 130 and is latched as the expected value val2 by the expected value acquisition latch 12. The write data WD is looped back to the read data latch 11. The looped-back read data RD is latched as the result value val1. The comparator 41 compares the result value val1 with the expected value val2. The comparator 41 repeats the comparison on multiple pieces of write data (phase 903).

The register control portion 42 references the comparison result. The RDLL 32 is supplied with the initial value for the right loopback slot tC. Therefore, the comparison result from the comparator 41 may be assumed to be ALL-PASS. However, the comparison might result in ONE-FAIL instead of ALL-PASS due to a variation in characteristics or jitters of the semiconductor device 120. The above-mentioned assumption is negated if the comparison results in ONE-FAIL.

There might be still yet another case where the above-mentioned assumption is negated. In this case, the right loopback slot tC may be considered to shift to a value earlier than the initial value due to a variation in the characteristics of the semiconductor device 120. As a result, the estimated right slot value tF may be also considered to shift to a value earlier than the initial value similarly. If the comparison results in ONE-FAIL, the right loopback slot tC and the estimated right slot value tF are updated to values one step earlier (phase 904). Control then proceeds to phase 910.

The loopback test results in ALL-FAIL on the right loopback fail value tD at phase 803 in the third phase 203. The right loopback fail value tD is assumed to be correct and is maintained as is. The normal operation phase can be repeated to correct the right loopback fail value tD even if it is shifted to an earlier value. That is, the procedure is repeated from phase 803, step 204a, phase 901, phase 903, and then to phase 904. As a result, the right loopback slot tC results in ALL-PASS at phase 903. The normal operation phase can be repeated to correct the right loopback fail value tD even if it is shifted to a later value. That is, the procedure is repeated from phase 803, phase 804, step 204b, phase 905, phase 907, and then to phase 909. As a result, the right loopback fail value tD results in ALL-FAIL at phase 803. The effect of repeating the normal operation phase is unchanged even if the right loopback fail value tD is delayed one step at phase 904 in relation to the right loopback slot tC.

The right loopback slot tC and the estimated right slot value tF may be considered to be correct if the comparison results in ALL-PASS according to the above-mentioned assumption. Accordingly, the right loopback fail value tD, the right loopback slot tC, and the estimated right slot value tF are maintained unchanged. Control then proceeds to phase 910.

The following describes phases 905 through 909 where the assumption in the third phase 203 is incorrect. The phases 905 and 906 are equal to the phases 601 and 602 and a description is omitted.

A loopback test is performed if it is determined that the semiconductor device 120 is requested to perform a write operation, that is, during writing. The register control portion 42 controls the delay selection portion 44 to supply the RDLL 32 with the initial value for the right loopback slot tC in the register file 45. The value supplied to the right loopback slot tC is one step later than the initial value at the third phase 203. Similarly to the phase 703, the write data output buffer 21, the read data input buffer 22, the strobe signal output buffer 23, and the strobe signal input buffer 24 are enabled.

At the same time, the external circuit 110 supplies the write data WD to the memory interface circuit 100. The write data WD is written to the memory device 130 and is latched as the expected value val2 by the expected value acquisition latch 12. The write data WD is looped back to the read data latch 11. The looped-back read data RD is latched as the result value val1. The comparator 41 compares the result value val1 with the expected value val2. The comparator 41 repeats the comparison on multiple pieces of write data (phase 907).

The register control portion 42 references the comparison result. The RDLL 32 is supplied with the right loopback slot tC one step later than the initial value. Therefore, the comparison result from the comparator 41 may be assumed to be ALL-PASS. However, the comparison might result in ONE-FAIL instead of ALL-PASS due to a variation in characteristics or jitters of the semiconductor device 120. The above-mentioned assumption is negated if the comparison results in ONE-FAIL.

There might be yet still another case where the above-mentioned assumption is negated. In this case, the right loopback slot tC can be assumed to be later than the value that should be specified originally. That is, the third phase 203 sets the right loopback slot tC one step later under the influence of contingency due to jitters and therefore may be considered to be invalid. To cancel the process at the third phase 203, the register control portion 42 updates the right loopback slot tC to a value one step earlier. Consequently, the right loopback slot tC is returned to the initial value (phase 908). Control then proceeds to phase 910.

The assumption at the third phase 203 might be also considered to be incorrect if no change is detected in the write data WD as described above. Also in this case, to cancel the process at the third phase 203, the register control portion 42 updates the right loopback slot tC to a value one step earlier. It is also possible to correct insufficient assumption caused by the write data WD.

There might be a case where the above-mentioned assumption is correct. In this case, it may be considered valid that the third phase 203 adjusted the right loopback slot tC one step later. The right loopback fail value tD and the estimated right slot value tF are updated to values one step later in accordance with the process of adjusting the right loopback slot tC one step later. The estimated left slot value tE may be also assumed to similarly vary with the left loopback slot tB. Accordingly, the estimated left slot value tE is also updated one step later (phase 909). As a result, the right loopback slot tC, the right loopback fail value tD, and the estimated right slot value tF can be set to proper values. Control then proceeds to phase 910.

Finally, the read delay value tG is calculated based on the most recent values for the estimated left slot value tE and the estimated right slot value tF configured in the fourth phase and the equation (1) above (phase 910).

The above-mentioned steps loop back write data supplied during writing. As a result, the memory interface circuit 100 can keep the read delay value tG optimal. The memory interface circuit 100 eliminates the need to provide a period for calibrating read data timings. The memory device can be fast driven because the memory interface circuit 100 can calibrate read data timings during normal write operations.

Figure 24:
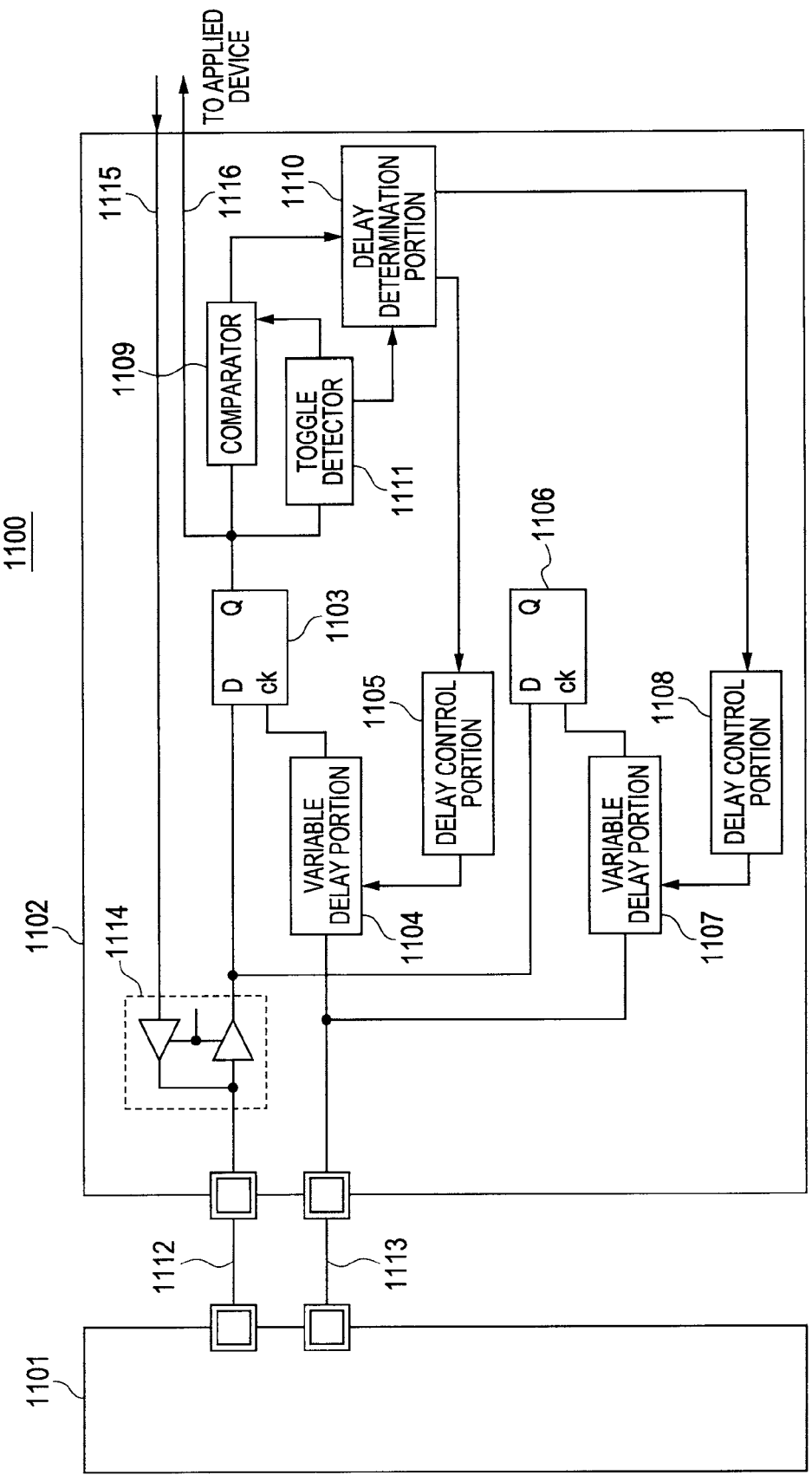
FIG. 24 is a function block diagram exemplifying a memory interface that adjusts timings between a strobe signal and a data signal during a normal memory access operation.

The configuration according to the embodiment does not need a circuit that is used exclusively for read data latch timings in the memory system 1100 as shown in FIG. 24. Accordingly, the configuration can provide the memory interface circuit with a circuit scale smaller than for memory interfaces of the related art.

A high-speed interface device needs to suppress variations in characteristics. For this purpose, a large-footprint transistor is used for a function block such as latch related to data writing or reading. As a result, the memory system 1100 as shown in FIG. 24 features a large circuit footprint because the system includes a large-scale block such as the second data latch portion 1106. On the other hand, the configuration according to the embodiment does not need such a large-scale block and therefore provides another advantage of suppressing the circuit scale.

The configuration must use the register portion. However, the register portion 43 just needs to maintain the values to through tG and suffices to use a small circuit configuration in the order of nanometers, for example. By contrast, a large-scale block such as the second data latch portion 1106 requires a circuit scale in the order of micrometers, for example. The register portion 43 poses no obstacle to suppressing the circuit scale. Therefore, the memory interface circuit 100, if provided with the register portion 43, can sufficiently reduce the circuit scale compared to the related art.

Further, the memory system 1100 in FIG. 24 needs to match characteristics between two systems, that is, the system including the first data latch portion 1103, the first variable delay portion 1104, and the first delay control portion 1105 and the system including the second data latch portion 1106, the second variable delay portion 1107, and the second delay control portion 1108. However, these blocks are physically separated from each other. Actually, it is impossible to match characteristics between the two systems. A characteristic difference between the two systems might undermine the reliability in the long run even if the memory system 1100 adjusts timings. The configuration according to the embodiment need not take this problem into consideration because the configuration does not need a block equivalent to the system including the second data latch portion 1106, the second variable delay portion 1107, and the second delay control portion 1108.

In addition, the memory system 1100 shown in FIG. 24 needs to detect a read data toggle. The memory system 1100 cannot adjust timings if no data is written to the memory device 1101 or data contains no toggle. An additional workaround against missing data toggle is needed. On the other hand, the configuration according to the embodiment performs a loopback test using write data and therefore is used with advantage even if no data is written to the memory device 1101 or only data without toggle is available.

According to the configuration, various initial values in the register file 45 are configured during the initialization phase. At this time, the external circuit 110 supplies test data to the memory interface circuit 100. The test data is also output to the memory device 130. However, the test data is not written to the memory device because the memory device (DDR3 SDRAM) is write-inhibited during the initialization phase. The DDR3 SDRAM standards specify control over the write inhibit state.

In other words, voltages vary at the data terminal 61 and the strobe terminal 62 of the semiconductor device 120 including the memory interface circuit 100 even during the initialization phase. A tester can be used to easily measure a voltage at the data terminal 61 and the strobe terminal 62. On the other hand, an ordinary memory controller does not vary voltages at the data terminal 61 and the strobe terminal 62 during the initialization phase or other cases than writing or reading. Accordingly, it is possible to determine whether the memory interface circuit 100 is included in the semiconductor device by measuring a voltage at the data terminal or the strobe terminal when write and read operations are not performed.

Second Embodiment

Figure 14:
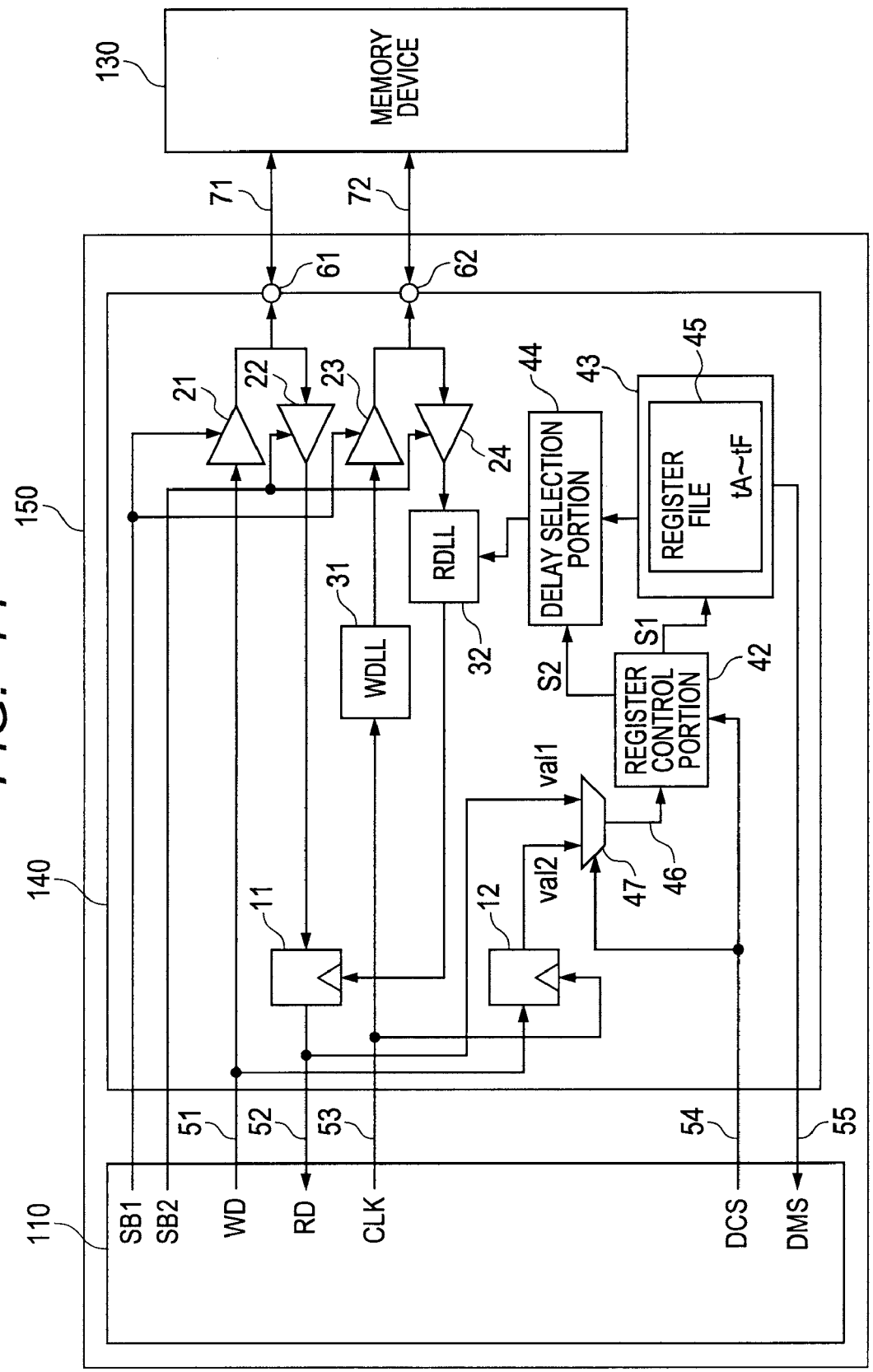
FIG. 14 is a circuit block diagram showing a configuration of a semiconductor device including a memory interface circuit according to a second embodiment.

The memory interface circuit according to the second embodiment will be described. FIG. 14 is a circuit block diagram showing a configuration of a semiconductor device 150 including a memory interface circuit 140 according to the second embodiment. The semiconductor device 150 is configured by replacing the memory interface circuit 100 in the semiconductor device 120 with the memory interface circuit 140. The semiconductor device 150 is otherwise configured similarly to the semiconductor device 120 and a description is omitted.

The memory interface circuit 100 according to the first embodiment must set the left loopback fail value tA, the left loopback slot tB, and the estimated left slot value tE to large values. As a result, the circuit scale of the RDLL 32 increases. On the other hand, the memory interface circuit 140 according to the second embodiment can supply the RDLL 32 with the left loopback fail value tA, the left loopback slot tB, and the estimated left slot value tE that are smaller than those for the memory interface circuit 100.

The memory interface circuit 140 replaces the comparator in the memory interface circuit 100 with a shifter comparator 47. The shifter comparator 47 has a function that shifts the timing to compare the result value val1 with the expected value val2. Specifically, the shifter comparator 47 compares a shifted result value val1_180 with the expected value val2 latched by the expected value acquisition latch 12 in accordance with the delay control signal DCS, for example. The shifted result value val1_180 is generated by delaying the result value val1 latched by the read data latch 11 as much as half a cycle (180 degrees). The memory interface circuit 140 is otherwise configured similarly to the memory interface circuit 100 and a description is omitted.

Figure 15:
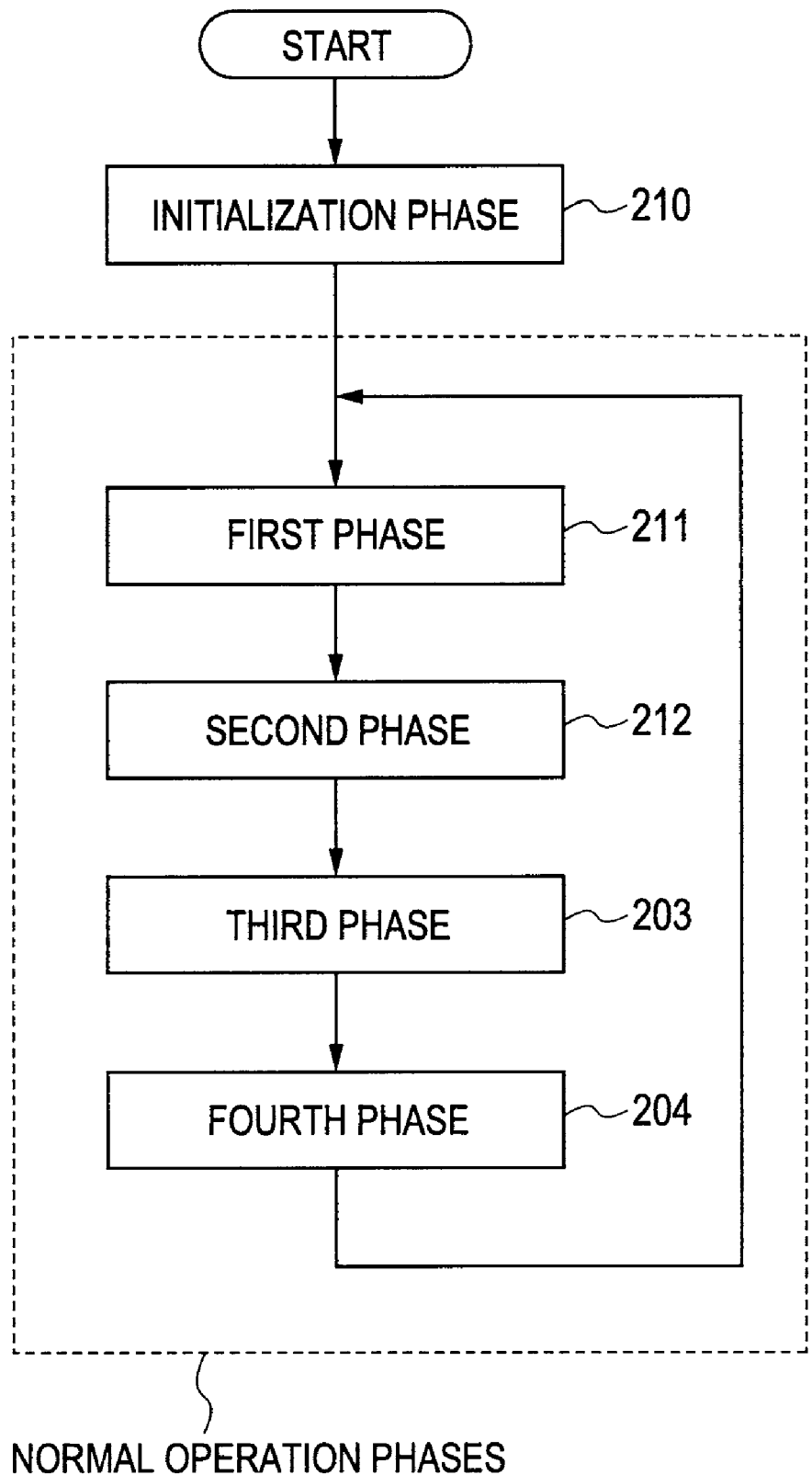
FIG. 15 is a flowchart showing operations of the memory interface circuit according to the second embodiment.

Operations of the memory interface circuit 140 will be described. FIG. 15 is a flowchart showing operations of the memory interface circuit 140 according to the second embodiment. The operations of the memory interface circuit 140 shown in FIG. 15 include an initialization phase 210, a first phase 211, and a second phase 212 corresponding to the initialization phase 200, the first phase 201, and the second phase 202 of the memory interface circuit 100, respectively.

Figure 16:
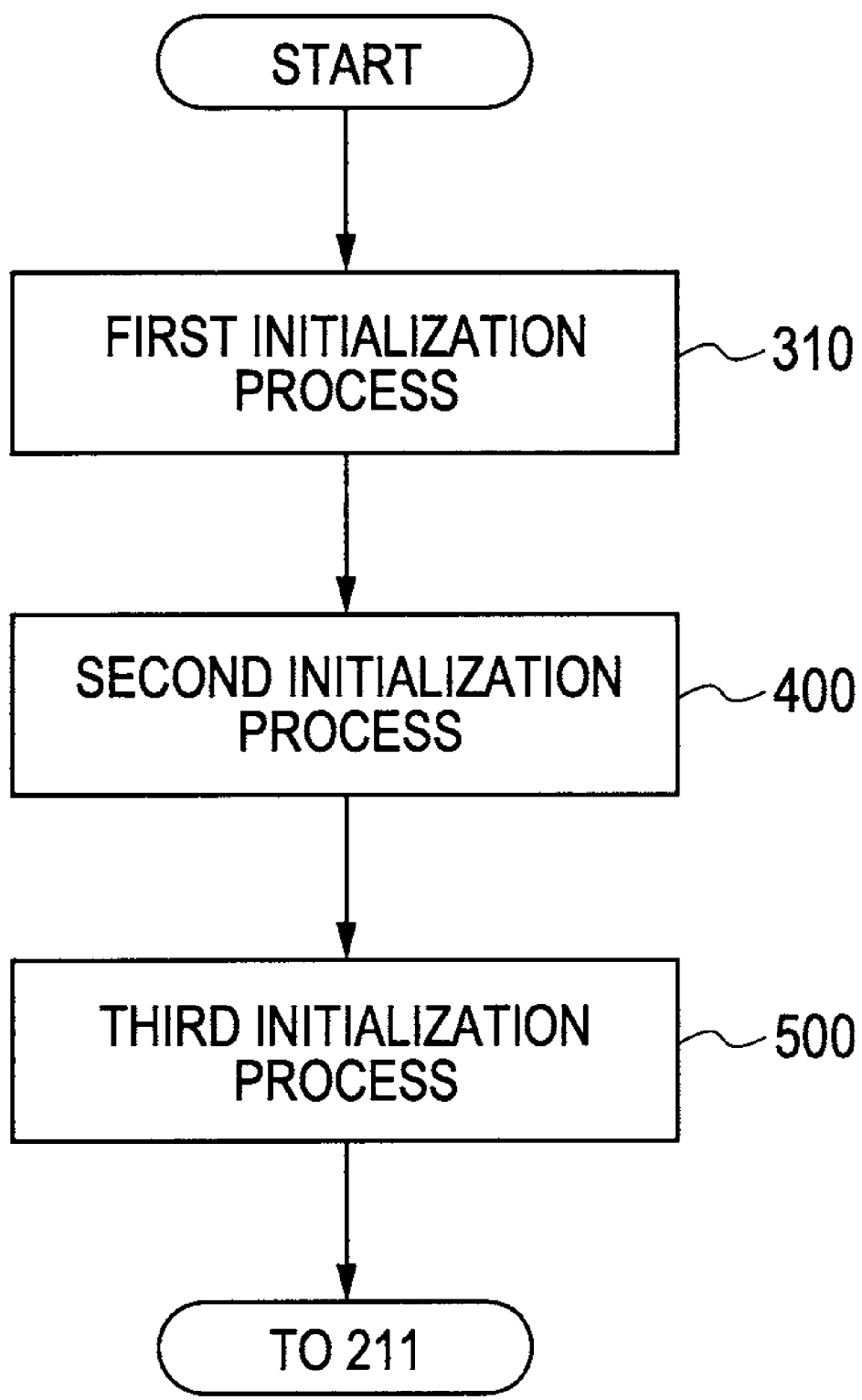
FIG. 16 is a flowchart showing operations in an initialization phase according to the second embodiment.

The initialization phase 210 will be described. FIG. 16 is a flowchart showing operations in the initialization phase 210. As shown in FIG. 16, the initialization phase 210 replaces the first initialization process 300 for the memory interface circuit 100 with a first initialization process 310. The following describes the first initialization process 310 as a difference.

Figure 17:
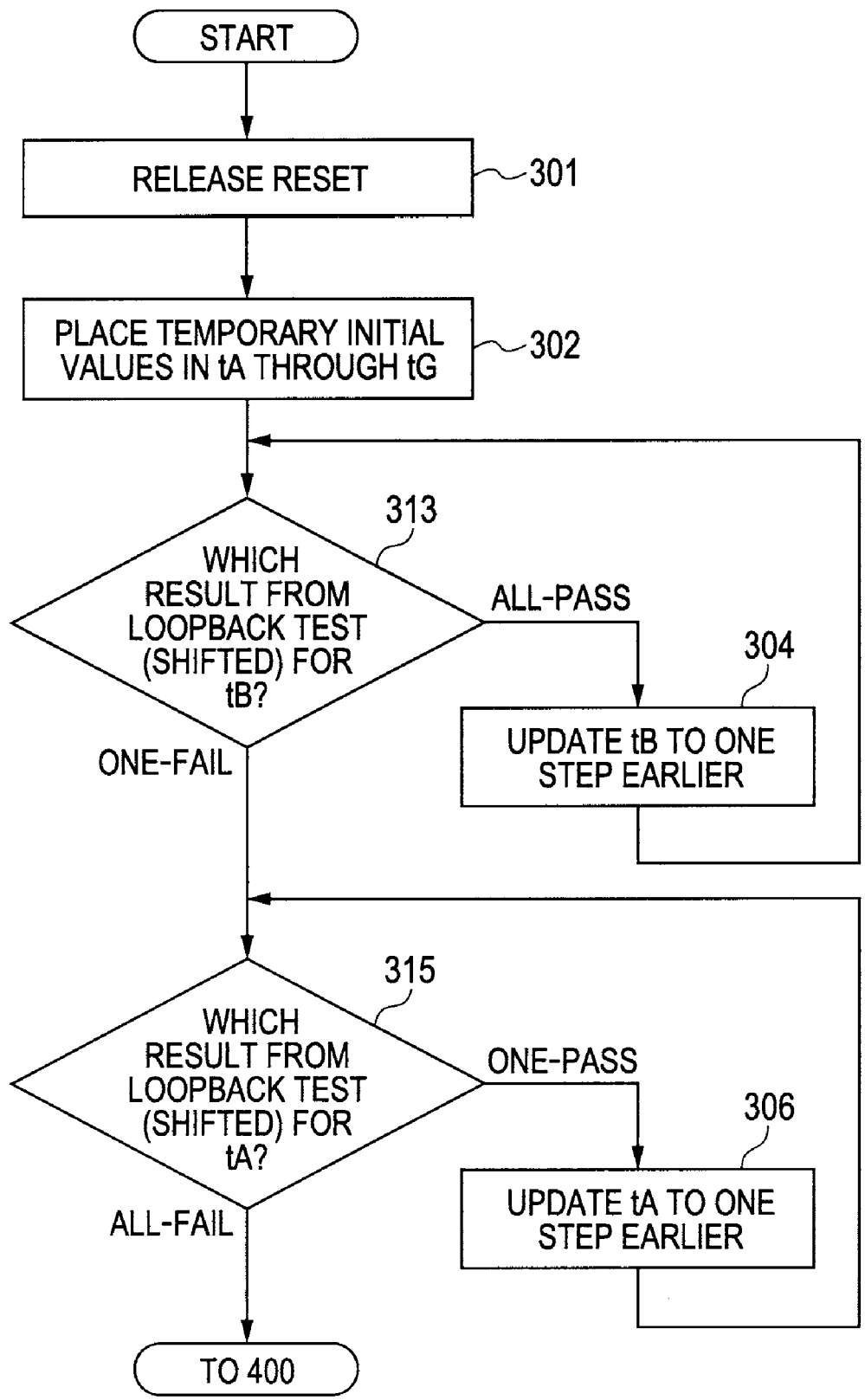
FIG. 17 is a flowchart showing operations in a first initialization process according to the second embodiment.
Figure 18:
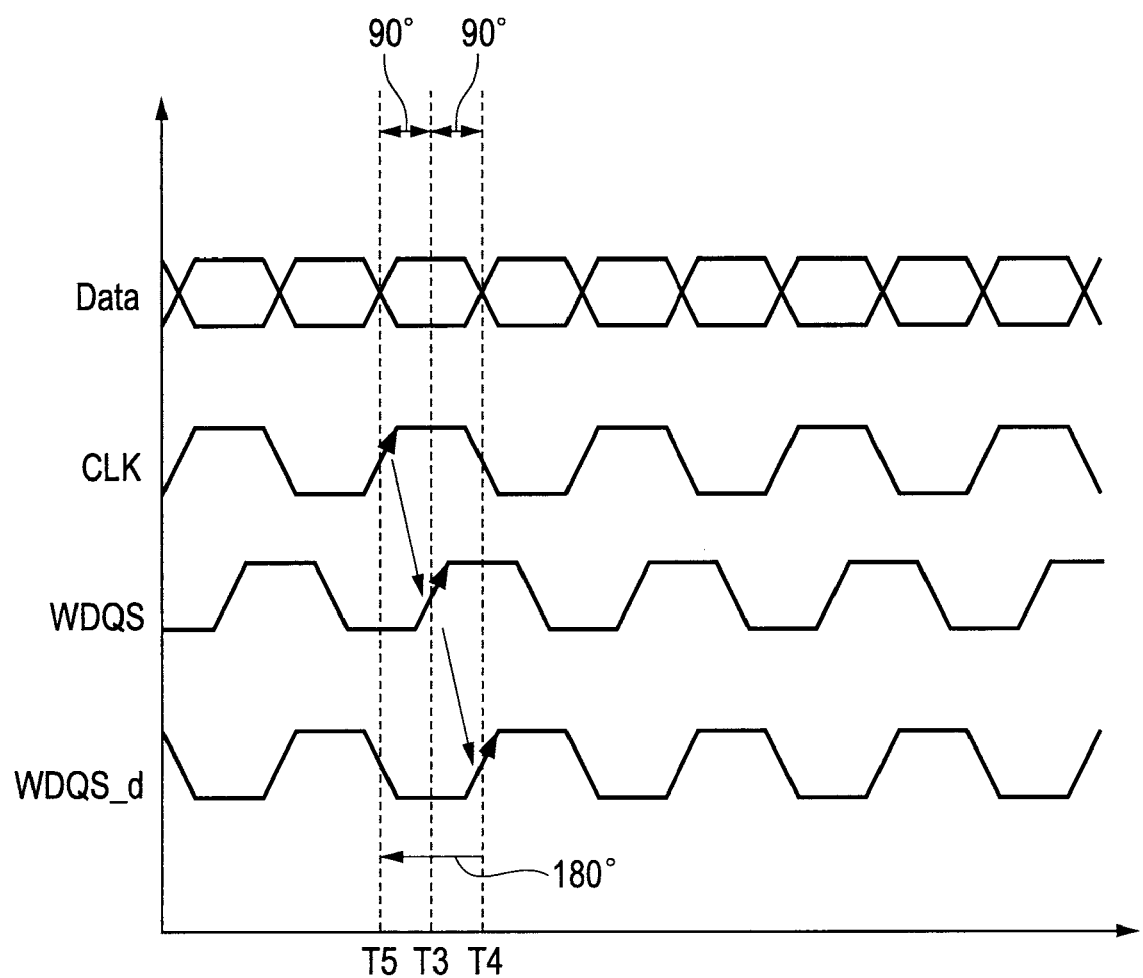
FIG. 18 is a timing chart exemplifying signal timings in the first initialization process according to the second embodiment.

FIG. 17 is a flowchart showing operations in the first initialization process 310. The first initialization process 310 replaces phases 303 and 305 for the memory interface circuit 100 with phases 313 and 315. At phases 313 and 315, the RDLL 32 delays the phase of the write strobe signal WDQS approximately 90 degrees. FIG. 18 is a timing chart exemplifying signal timings in the first initialization process 310. The RDLL 32 delays the rise (timing T4) of the delayed write strobe signal WDQS_d 90 degrees from the rise (timing T3) of the write strobe signal WDQS.

In this state, the shifter comparator 47 performs comparison accompanied by a half-cycle delay as mentioned above. That is, the shifter comparator 47 performs comparison using a value latched at the timing T5 as the result value val1. This makes it possible to search for initial values for the left loopback fail value tA and the left loopback slot tB. In this case, the left loopback fail value tA and the left loopback slot tB are set to approximately 90 degrees. The other operations of the first initialization process 310 are similar to those of the first initialization process 300 and a description is omitted.

Figure 19:
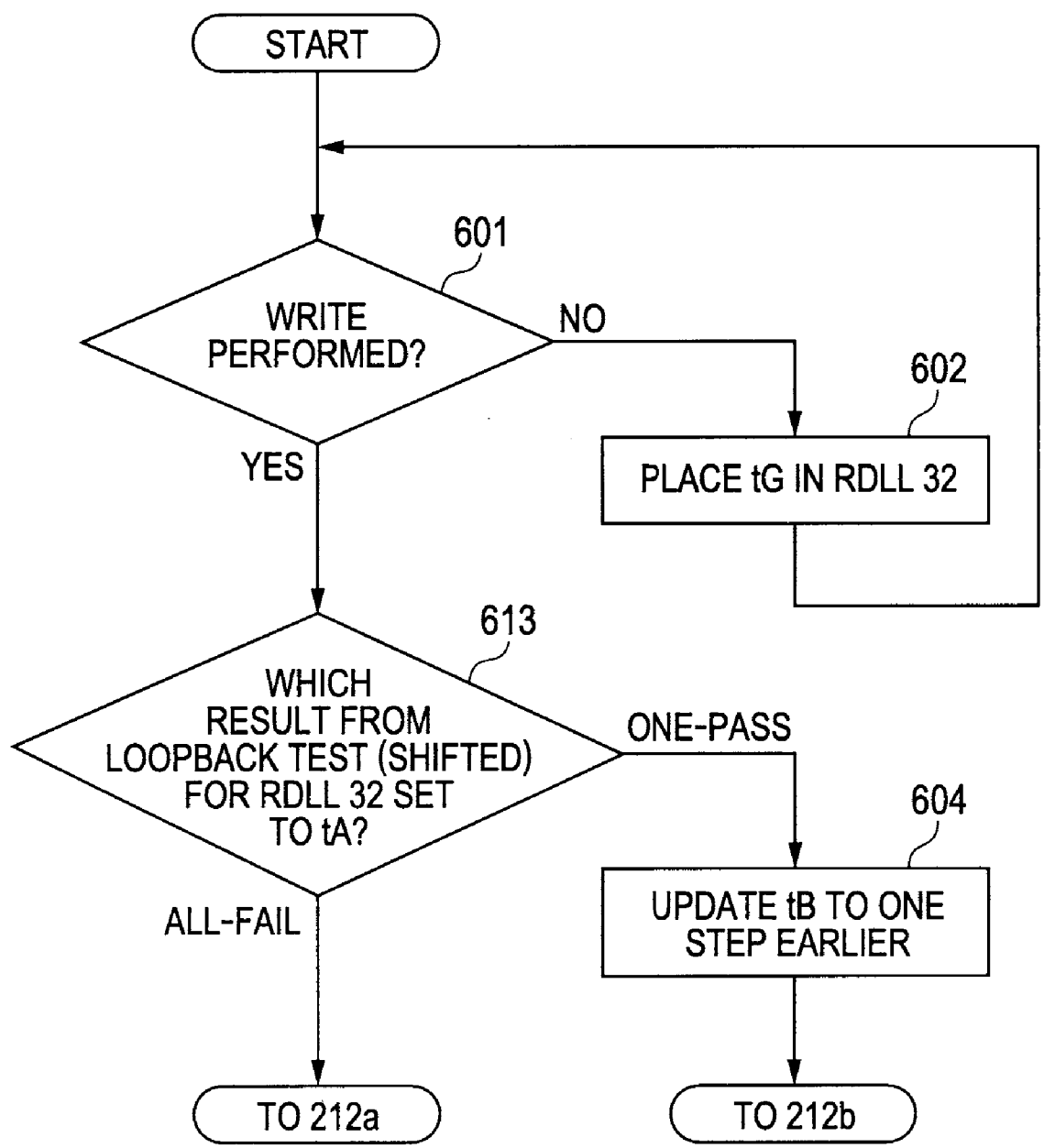
FIG. 19 is a flowchart showing operations in a first phase 211 according to the second embodiment.

The first phase 211 will be described. FIG. 19 is a flowchart showing operations in the first phase 211. The first phase 211 replaces phase 603 in the first phase 201 for the memory interface circuit 100 with phase 613. At phase 613, the shifter comparator 47 performs comparison accompanied by a half-cycle delay similarly to phases 313 and 315 in the first initialization process 310. Also in this case, the left loopback fail value tA and the left loopback slot tB are set to approximately 90 degrees. The other operations of the first phase 211 are similar to those of the first phase 201 and a description is omitted.

Figure 20:
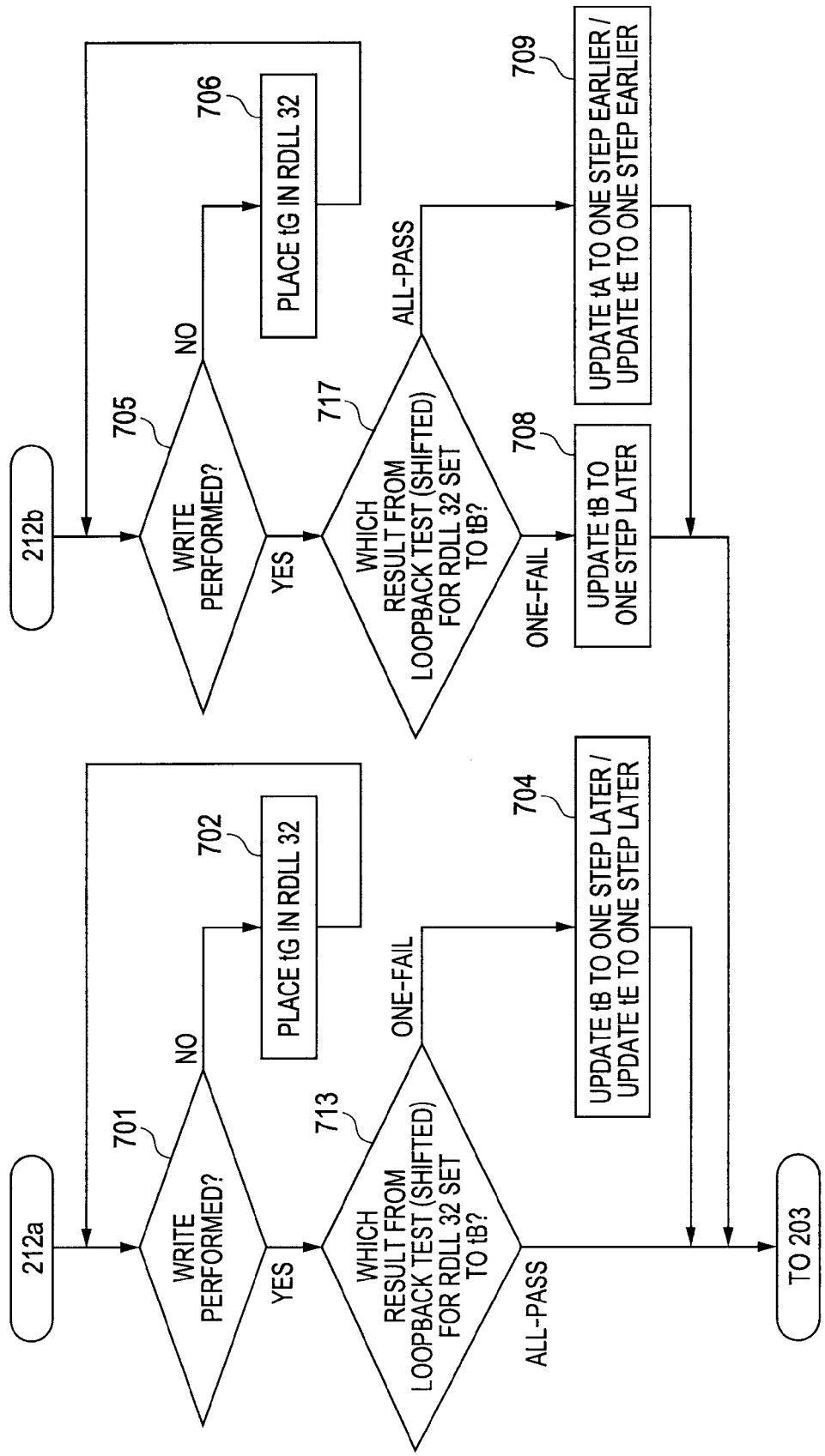
FIG. 20 is a flowchart showing operations in a second phase 212 according to the second embodiment.

The second phase 212 will be described. FIG. 20 is a flowchart showing operations in the second phase 212. The second phase 212 replaces phases 703 and 707 in the second phase 202 for the memory interface circuit 100 with phases 713 and 717, respectively. At phases 713 and 717, the shifter comparator 47 performs comparison accompanied by a half-cycle delay similarly to phases 313 and 315 in the first initialization process 310. Also in this case, the left loopback fail value tA, the left loopback slot tB, and the estimated left slot value tE are set to approximately 90 degrees. The other operations of the second phase 212 are similar to those of the second phase 202 and a description is omitted.

The configuration can make the left loopback fail value tA, the left loopback slot tB, and the estimated left slot value tE smaller than those for the memory interface circuit 100 according to the first embodiment. As a result, the circuit area of the RDLL 32 can be prevented from increasing and the memory interface circuit 140 can be miniaturized.

Third Embodiment

Figure 21:
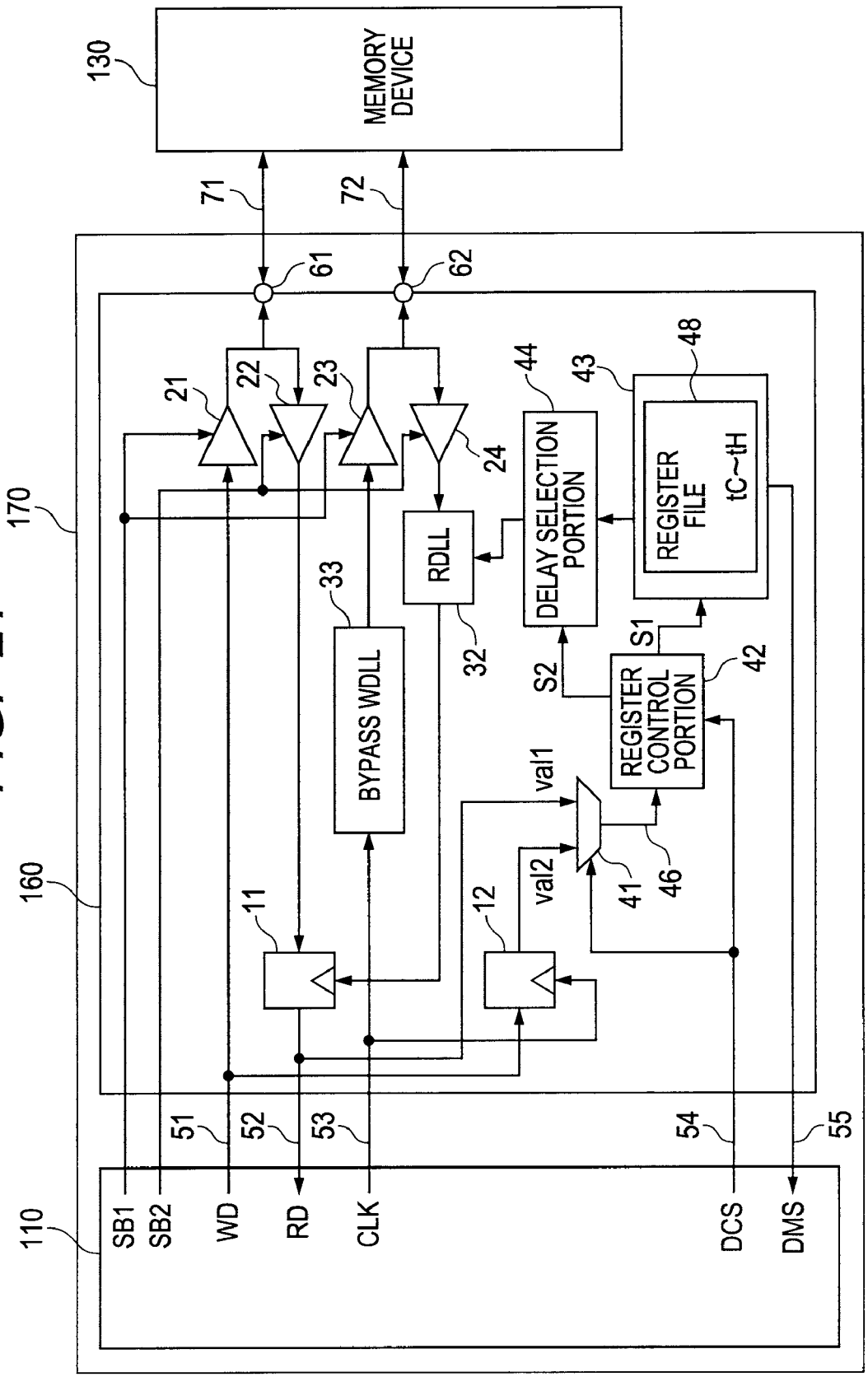
FIG. 21 is a circuit block diagram showing a configuration of a semiconductor device including a memory interface circuit according to a third embodiment.

The memory interface circuit according to the third embodiment will be described. FIG. 21 is a circuit block diagram showing a configuration of a semiconductor device 170 including a memory interface circuit 160 according to the third embodiment. The semiconductor device 170 replaces the memory interface circuit 100 of the semiconductor device 120 with the memory interface circuit 160. The semiconductor device 170 is otherwise configured similarly to the semiconductor device 120 and a description is omitted.

The memory interface circuit 160 replaces the WDLL 31 of the memory interface circuit 100 with a bypass WDLL 33. The memory interface circuit 160 also replaces the register file 45 with a register file 48. The bypass WDLL 33 has a function that bypasses and outputs the clock signal CLK as is in accordance with the delay control signal DCS.

The register file 48 contains an initial value tH for the estimated right slot value in addition to the other values contained in the register file 45.

Figure 22:
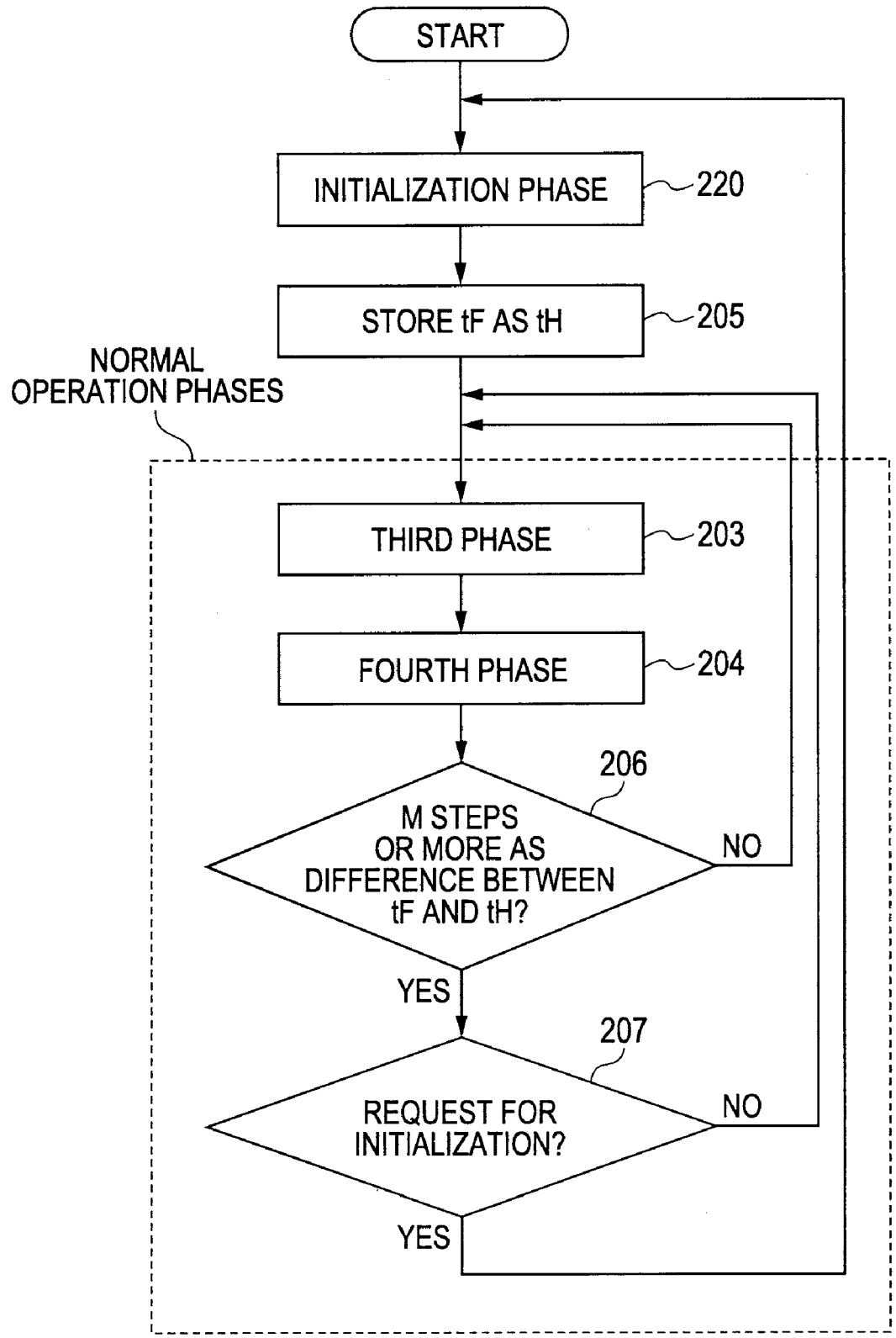
FIG. 22 is a flowchart showing operations of the memory interface circuit according to the third embodiment.

Operations of the memory interface circuit 160 according to the third embodiment will be described. FIG. 22 is a flowchart showing operations of the memory interface circuit 160 according to the third embodiment. The initialization phase 220 performs the second initialization process 400 and the third initialization process 500. The memory interface circuit 160 is void of the first initialization process 300 of the memory interface circuit 100.

After termination of the initialization phase 220, the register control portion 42 controls the register portion 43 to store an initial value for the estimated right slot value tF as an initial value tH for the estimated right slot value (phase 205).

Third phase 203 and fourth phase 204 are then performed similarly to the memory interface circuit 100. That is, the memory interface circuit 160 is void of first phase 201 and second phase 202 compared to the memory interface circuit 100. Third phase 203 and fourth phase 204 are performed under the assumption that the initial value tH for the estimated right slot value is unchanged.

The register control portion 42 then compares the most recent estimated right slot value tF found through third phase 203 and fourth phase 204 with the initial value tH for the estimated right slot value (phase 206). In this manner, the register control portion 42 determines how many steps the estimated right slot value tF differs from the initial value tH for the estimated right slot value. The register control portion 42 is previously supplied with a reference step count M used as the determination reference.

Control returns to third phase 203 and the process is repeated if a difference between the estimated right slot value tF and the initial value tH for the estimated right slot value is fewer than M steps. Control proceeds to phase 207 if a difference between the estimated right slot value tF and the initial value tH for the estimated right slot value is M steps or more.

At phase 207, the register control portion 42 determines whether the external circuit 110 permits initialization of the memory interface circuit. If the initialization is not permitted, control returns to the third phase and the process is repeated. If the initialization is permitted, control returns to the initialization phase 210 and the initialization is performed.

The memory interface circuit 160 focuses on a boundary to the right of the slot and compares a change in the delay amount during normal memory access operation with the initial value. The memory interface circuit 160 checks if a comparison result is within the allowable range, that is, if a difference between the delay amount and the initial value is fewer than M steps. As a result, the calibration is performed if the comparison result is outside the allowable range.

The estimated left slot value tE needs to be determined in order to calculate the read delay value tG. The estimated left slot value tE can be determined by performing the initialization phase 200 according to the first embodiment, for example. The left loopback fail value to and the left loopback slot tB needs to be determined in order to determine the estimated left slot value tE. However, no write data is needed during the initialization phase. A write strobe signal may be generated freely.

That is, the bypass WDLL 33 can output the write strobe signal WDQS without delaying the clock signal CLK to determine the left loopback fail value tA, the left loopback slot tB, and the estimated left slot value tE. In this case, the RDLL just needs to supply a slight delay amount to the write strobe signal WDQS in order to search for the left loopback fail value tA, the left loopback slot tB, and the estimated left slot value tE. Accordingly, the delay amount to be set to the RDLL 32 can be limited more than the first embodiment.

The configuration need not give special consideration to the left loopback fail value tA, the left loopback slot tB, and the estimated left slot value tE that must be set to large values. Similarly to the second embodiment, the third embodiment can suppress the circuit scale of the RDLL 32.

Fourth Embodiment

Figure 23:
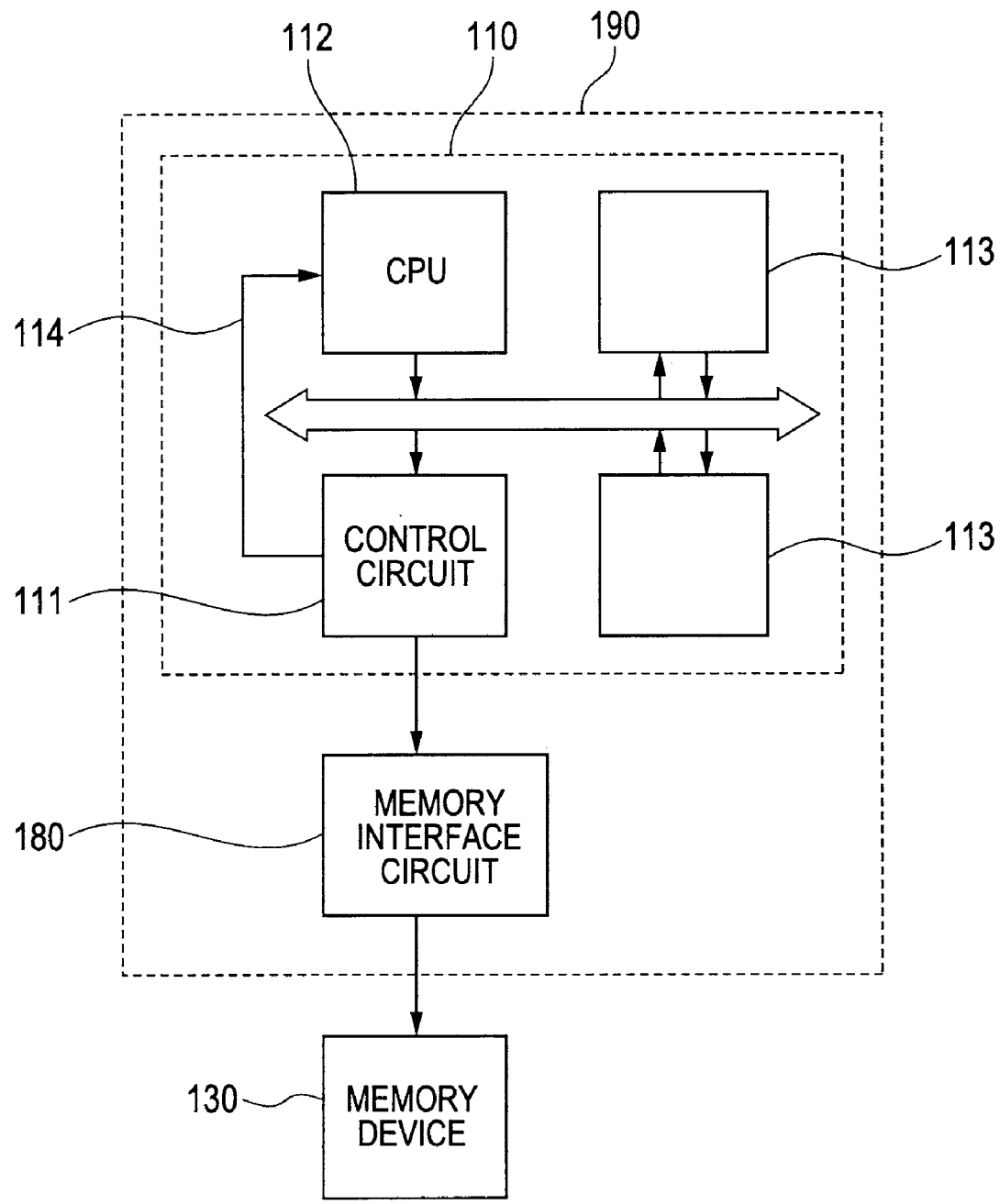
FIG. 23 is a block diagram showing a configuration of a memory system according to a fourth embodiment.

A memory system 1000 according to the fourth embodiment will be described. FIG. 23 is a block diagram showing a configuration of the memory system 1000 according to the fourth embodiment. The memory system 1000 includes a semiconductor device 190 and a memory device 130. The memory system 1000 is configured as an applied device including the semiconductor device 190.

The semiconductor device 190 includes a memory interface circuit 180 and the external circuit 110. The external circuit 110 includes a control circuit 111 and a CPU 112. The external circuit 110 may include the control circuit 111 and other function blocks 113. The memory interface circuit 180 is equivalent to any one of the memory interface circuits 100, 140, and 160.

The CPU 112 controls overall operations of the semiconductor device 190. The control circuit 111 controls the memory interface circuit 180 and the memory device 130 and monitors their states at the same time.

The control circuit 111 monitors states of the memory interface circuit 180 and the memory device 130 and determines whether the calibration needs to be retried. Specifically, the control circuit 111 monitors values in the register file using the delay monitor signal DMS. If a register file value exceeds the reference range, the control circuit 111 outputs an interrupt signal 114 to the CPU 112 to issue an interrupt request to the CPU 112.

The CPU 112 receives the interrupt signal 114 and allocates a memory space for the calibration to the memory space in the CPU 112. If the memory bandwidth is insufficient, the CPU 112 temporarily limits the functions to decrease the memory bandwidth and issues an intermittent calibration request to the control circuit 111.

When receiving the intermittent calibration request, the control circuit 111 performs the initialization (intermittent calibration) on the memory interface circuit 180 according to the same procedure as the initialization phase 200 in the first embodiment while no memory access occurs.

The control circuit 111 detects termination of the intermittent calibration on the memory interface circuit 180 using the delay monitor signal DMS. After the detection, the control circuit 111 issues the interrupt signal 114 to notify the CPU 112 of termination of the intermittent calibration.

The CPU 112 is notified of termination of the intermittent calibration and frees the memory space allocated to the intermittent calibration. The CPU 112 then returns to the normal operation.

The configuration can appropriately initialize the memory interface circuit 180 in accordance with states of the memory interface circuit 180. The memory system can perform operations in accordance with even a drastic change in states such as the temperature.

The configuration temporarily separates the memory space and the memory bandwidth from the memory system 1000 in order to perform the intermittent calibration. Memory access operations are not hindered even though the throughput temporarily decreases during the intermittent calibration. Memory access operations can be stabilized without sacrifice of memory access acceleration.

The present invention is not limited to the above-mentioned embodiments but may be otherwise variously embodied within the spirit and scope of the invention. For example, WDLL and RDLL can be replaced by other blocks if delay values are adjustable.

It is to be distinctly understood that the semiconductor device 190 according to the fourth embodiment can be installed in not only the memory system but also other applied devices.

What is claimed is:

1. A memory interface circuit comprising:
a data output buffer that outputs write data received from outside during writing to a memory device;
a write delay-locked loop that outputs a write strobe signal to the memory device through a strobe signal output buffer, wherein the write strobe signal is generated by delaying a phase of a clock signal received from outside during writing;
a first latch that latches the write data from the outside in synchronization with the clock signal;
a data input buffer that outputs read data received from the memory device during reading;
a read delay-locked loop that outputs a delayed read strobe signal generated by delaying a phase of a read strobe signal received from the memory device through a strobe signal input buffer during reading and outputs a delayed write strobe signal generated by delaying a write strobe signal looped back from the strobe signal output buffer through the strobe signal input buffer during writing;
a second latch that latches the read data from the data input buffer during reading in synchronization with the delayed read strobe signal and latches the write data looped back from the data output buffer through the data input buffer during writing in synchronization with the delayed write strobe signal;
a comparator that compares output from the first latch with output from the second latch during writing and outputs a comparison result as a comparison result signal;
a register portion that stores a delay value to be supplied to the read delay-locked loop in order to delay one of the write strobe signal and the read strobe signal;
a register control portion that updates the delay value stored in the register portion in accordance with the comparison result signal; and
a delay selection portion that is controlled by the register control portion and supplies the read delay-locked loop with the delay value stored in the register portion.

2. The memory interface circuit according to claim 1,
wherein the comparator performs a plurality of comparison operation corresponding to pieces of the write data and determines whether an output value from the first latch matches an output value from the second latch in all comparison results.

3. The memory interface circuit according to claim 1,
wherein an initialization operation initializes the delay value stored in the register portion;
wherein the register control portion calibrates latch timing of the read data during the initialization operation and accordingly determines a first delay value corresponding to a latest timing at which the second latch is capable of correctly latching the read data;
wherein the register control portion determines an initial read delay value to be supplied to the read delay-locked loop during reading in accordance with the first delay value; and
wherein the register control portion successively updates the first delay value during writing after the initialization operation and successively updates the read delay value.

4. The memory interface circuit according to claim 1,
wherein the register control portion determines a second delay value corresponding to a latest timing at which an output value from the first latch matches an output value from the second latch in all the comparison results;
wherein the register control portion detects a variation in the second delay value due to a state change in the memory interface circuit during writing after the initialization operation; and
wherein the register control portion changes the first delay value in relation to a variation in the second delay value.

5. The memory interface circuit according to claim 4,
wherein, during the initialization operation, the register control portion determines a third delay value corresponding to a latest timing at which an output value from the first latch does not match an output value from the second latch in all the comparison results;
wherein the register control portion supplies the third delay value to the read delay-locked loop to perform the comparison operations during writing after the initialization operation and updates the second delay value to a value one step later when at least one comparison result indicates mismatch between an output value from the first latch and an output value from the second latch;
wherein, when updating the second delay value, the register control portion supplies the updated second delay value to the read delay-locked loop to perform the comparison operations, updates the first delay value and the third delay value to values one step later when at least one comparison result indicates mismatch between an output value from the first latch and an output value from the second latch, and updates the second delay value to a value one step earlier when an output value from the first latch matches an output value from the second latch in all the comparison results; and
wherein, when not updating the second delay value, the register control portion supplies the second delay value to the read delay-locked loop to perform the comparison operations, updates the first delay value and the second delay value to values one step earlier when at least one comparison result indicates mismatch between an output value from the first latch and an output value from the second latch, and maintains the second delay value as is when an output value from the first latch matches an output value from the second latch in all the comparison results.

6. The memory interface circuit according to claim 3,
wherein the register control portion calibrates latch timing of the read data during the initialization operation and accordingly determines a fourth delay value corresponding to an earliest timing at which the second latch is capable of correctly latching the read data;
wherein the register control portion determines the initial read delay value in accordance with the first delay value and the fourth delay value; and
wherein the register control portion successively updates the first delay value and the fourth delay value during writing after the initialization operation and successively updates the read delay value.

7. The memory interface circuit according to claim 6,
wherein, during the initialization operation, the register control portion determines a fifth delay value corresponding to an earliest timing at which an output value from the first latch matches an output value from the second latch in all the comparison results;
wherein the register control portion detects a variation in the fifth delay value due to a state change in the memory interface circuit during writing after the initialization operation; and
wherein the register control portion changes the fourth delay value in relation to a variation in the fifth delay value.

8. The memory interface circuit according to claim 7,
wherein, during the initialization operation, the register control portion determines a sixth delay value corresponding to an earliest timing at which an output value from the first latch does not match an output value from the second latch in all the comparison results;
wherein the register control portion supplies the sixth delay value to the read delay-locked loop to perform the comparison operations during writing after the initialization operation and updates the fifth delay value to a value one step earlier when at least one comparison result indicates mismatch between an output value from the first latch and an output value from the second latch;
wherein, when updating the fifth delay value, the register control portion supplies the updated fifth delay value to the read delay-locked loop to perform the comparison operations, updates the fourth delay value and the sixth delay value to values one step earlier when at least one comparison result indicates mismatch between an output value from the first latch and an output value from the second latch, and updates the fifth delay value to a value one step later when an output value from the first latch matches an output value from the second latch in all the comparison results; and
wherein, when not updating the fifth delay value, the register control portion supplies the fifth delay value to the read delay-locked loop to perform the comparison operations, updates the fourth delay value and the fifth delay value to values one step later when at least one comparison result indicates mismatch between an output value from the first latch and an output value from the second latch, and maintains the fifth delay value as is when an output value from the first latch matches an output value from the second latch in all the comparison results.

9. The memory interface circuit according to claim 7,
wherein the comparator supplies one of the fifth delay value and the sixth delay value to the read delay-locked loop to perform the comparison operations by comparing an output value from the first latch with an output value from the second latch accompanied by a half cycle of the delayed write strobe signal later than the output from the first latch.

10. The memory interface circuit according to claim 6,
wherein the register control portion compares the updated fourth delay value with an initial value thereof and outputs a signal to an external control circuit when a difference between the updated fourth delay value and an initial value thereof is greater than a specified value; and
wherein the external control circuit controls the register portion in accordance with the signal to initialize the fourth to sixth delay values.

11. The memory interface circuit according to claim 10,
wherein the write delay-locked loop outputs the clock signal unchanged as the write strobe signal during the initialization operation; and
wherein the fourth delay value is applied to the read delay-locked loop to perform the comparison operations and is then found to be equivalent to an earliest timing at which an output value from the first latch matches an output value from the second latch in all the comparison results.

12. The memory interface circuit according to claim 6,
wherein the read delay value is intermediate between the first delay value and the fourth delay value.

13. A semiconductor device comprising:
the memory interface circuit according to claim 3;
a control circuit that controls the memory interface circuit; and
a CPU that controls the memory interface circuit and a control circuit,
wherein the control circuit monitors the delay value stored in the register portion using a delay monitor signal output from the register control portion and outputs an interrupt signal to the CPU when the delay value stored in the register portion becomes greater than a predetermined reference value;
wherein, when receiving the interrupt signal, the CPU requests the control circuit to perform an initialization operation while the memory device is not requested to be accessed; and
wherein the control circuit outputs a delay control signal to the register control portion in response to the initialization request and allows the memory interface circuit to perform the initialization operation.

14. An applied device including the semiconductor device according to claim 13.

* * * * *